US009436083B2

(12) United States Patent
Domon et al.

(10) Patent No.: US 9,436,083 B2
(45) Date of Patent: *Sep. 6, 2016

(54) CHEMICALLY-AMPLIFIED NEGATIVE RESIST COMPOSITION AND RESIST PATTERNING PROCESS USING THE SAME

(71) Applicant: SHIN-ETSU CHEMICAL CO., LTD., Tokyo (JP)

(72) Inventors: Daisuke Domon, Jyoetsu (JP); Keiichi Masunaga, Jyoetsu (JP); Satoshi Watanabe, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/637,013

(22) Filed: Mar. 3, 2015

(65) Prior Publication Data
US 2015/0268556 A1  Sep. 24, 2015

(30) Foreign Application Priority Data

Mar. 24, 2014  (JP) .................................. 2014-60411

(51) Int. Cl.
G03F 7/038  (2006.01)
G03F 7/30  (2006.01)
G03F 7/004  (2006.01)

(52) U.S. Cl.
CPC ........... *G03F 7/0382* (2013.01); *G03F 7/0045* (2013.01); *G03F 7/0046* (2013.01); *G03F 7/30* (2013.01)

(58) Field of Classification Search
None
See application file for complete search history.

(56) References Cited

U.S. PATENT DOCUMENTS

| | | | | |
|---|---|---|---|---|
| 6,136,500 A * | 10/2000 | Kobayashi | ............... | G03F 7/004 430/270.1 |
| 6,492,091 B2 * | 12/2002 | Kodama | ............... | G03F 7/0045 430/270.1 |
| 6,924,323 B2 * | 8/2005 | Ishihara | ................. | C07C 53/21 430/170 |
| 7,202,015 B2 * | 4/2007 | Kanna | ................... | G03F 7/0045 430/270.1 |
| 8,697,903 B2 * | 4/2014 | Kinsho | ................... | C07C 51/00 526/242 |
| 2001/0036589 A1 | 11/2001 | Kinoshita et al. | | |
| 2001/0041300 A1 * | 11/2001 | Kodama | ............... | G03F 7/0045 430/170 |
| 2002/0051933 A1 | 5/2002 | Kodama et al. | | |
| 2008/0118860 A1 | 5/2008 | Harada et al. | | |
| 2008/0153030 A1 * | 6/2008 | Kobayashi | ............ | G03F 7/0397 430/270.1 |
| 2008/0241752 A1 * | 10/2008 | Mizutani | ............... | G03F 7/0392 430/286.1 |
| 2011/0177453 A1 * | 7/2011 | Masubuchi | ........... | C07C 309/12 430/270.1 |
| 2011/0212390 A1 * | 9/2011 | Masunaga | ............. | G03F 7/0046 430/5 |

(Continued)

FOREIGN PATENT DOCUMENTS

JP  H11-327143 A  11/1999
JP  2004115630 A  4/2004

(Continued)

OTHER PUBLICATIONS

Jan. 6, 2016 Office Action Issued in U.S. Appl. No. 14/637,013.

(Continued)

*Primary Examiner* — Martin Angebranndt
(74) *Attorney, Agent, or Firm* — Oliff PLC

(57) ABSTRACT

The present invention provides a chemically-amplified negative resist composition including a sulfonium salt capable of providing a pattern having an extremely high resolution with reduced line edge roughness, and also provides a resist patterning process using the same.

The present invention was accomplished by a chemically-amplified negative resist composition including (A) a salt represented by the following general formula (1) and (B) a resin containing one or more kinds of repeating unit represented by the following general formulae (UN-1) and (UN-2) and a resist patterning process using the same.

20 Claims, No Drawings

(56) References Cited

U.S. PATENT DOCUMENTS

| | | | | |
|---|---|---|---|---|
| 2011/0212391 A1* | 9/2011 | Masunaga | G03F 7/0045 430/5 |
| 2012/0083580 A1* | 4/2012 | Kinsho | C07C 51/00 526/242 |
| 2013/0157201 A1* | 6/2013 | Takaki | G03F 7/004 430/325 |
| 2014/0308614 A1* | 10/2014 | Hasegawa | G03F 7/038 430/281.1 |
| 2015/0086926 A1* | 3/2015 | Ohashi | C07C 381/12 430/285.1 |
| 2015/0253664 A1* | 9/2015 | Domon | G03F 7/0397 430/285.1 |
| 2015/0323865 A1* | 11/2015 | Sagehashi | G03F 7/0397 430/285.1 |

FOREIGN PATENT DOCUMENTS

| | | |
|---|---|---|
| JP | 2006201532 A | 8/2006 |
| JP | 2006215180 A | 8/2006 |
| JP | 3955384 B2 | 8/2007 |
| JP | 2008111103 A | 5/2008 |
| JP | 2008249762 A | 10/2008 |
| JP | 2009-086310 * | 4/2009 |
| JP | 2012097256 A | 5/2012 |
| TW | 1288298 B | 10/2007 |
| TW | 201142503 A | 12/2011 |

OTHER PUBLICATIONS

Dec. 2, 2015 Office Action issued in Taiwanese Application No. 104109123.

* cited by examiner

CHEMICALLY-AMPLIFIED NEGATIVE RESIST COMPOSITION AND RESIST PATTERNING PROCESS USING THE SAME

BACKGROUND OF THE INVENTION

1. Field of the Invention

The present invention relates to a chemically-amplified negative resist composition used for processing a semiconductor and a photo mask blank, and a resist patterning process using the same.

2. Description of the Related Art

In recent years, as an integrated circuit progresses toward a high integration, a further finer patterning is required. When a resist pattern of 0.2 μm or less is processed, as a usual manner, a chemically amplified resist composition in which an acid acts as a catalyst has been used. As the exposure light source, a high energy beam such as an ultraviolet beam, a far-ultraviolet beam and an electron beam has been used, and especially, electron beam lithography, which is used as ultrafine processing technique, has become indispensable as a method of processing a photo mask blank in producing a photomask used for semiconductor manufacturing.

Polymers having a large amount of aromatic skeleton with acidic side chain, such as polyhydroxystyrene, have been favorably used as a resist composition for KrF excimer laser, but not for ArF excimer laser because they exhibit large absorption to light whose wavelength is approximately 200 nm. Due to high etching resistance, however, this type of polymer essentially serves as a useful resist composition for electron beam and as a resist composition for extreme ultraviolet (EUV) to form a finer pattern than a processing limit using an ArF excimer laser.

There are two types of resist compositions: a positive resist composition whose exposed area is dissolved and a negative resist composition whose exposed area is processed into a pattern, and they are selected according to a resist pattern to be required. A chemically-amplified negative resist composition normally contains a polymer that dissolves in an aqueous alkaline developer, an acid generator that generates an acid by decomposition of a resist film by exposure and a crosslinking agent that insolubilizes a polymer in a developer by forming a crosslink between polymers using an acid as a catalyst (a polymer and a crosslinking agent can be integrated). In addition, a basic compound for controlling diffusion of an acid generated by exposure is usually added thereto.

Many negative resist compositions using a phenol unit as an alkali-soluble unit composing the above polymer that dissolves in an aqueous alkaline developer have been investigated for exposure particularly with KrF excimer laser beam. In fact, these negative resist compositions have not been used for ArF excimer laser beam because a phenol unit has no transmittance to an exposure light whose wavelength is 150 to 220 nm. Recently, however, they have received a growing technical attention as a negative resist composition for EB and EUV exposure, which are used in exposure method for forming a finer pattern, and examples thereof are disclosed in Patent Documents 1, 2 and 3.

Meanwhile, to control resist sensitivity and pattern profile, various improvements have been achieved according to the way materials used in a resist composition are selected, combined and processed. One of its effective improvements is to control diffusion of an acid that has a significant impact on resolution of a chemically-amplified resist.

Acid diffusion control agent is substantially essential component to control acid diffusion and improve resist performance. Development of an acid diffusion control agent has conventionally been discussed in various manners, and amine and acidulous onium salt are commonly used. As for an example of the acidulous onium salt, Patent Document 4 describes that the addition of triphenylsulfonium acetate enables a favorable resist pattern without T-top shape, line width difference between a dense pattern and an isolated pattern, and standing wave to be formed. Patent Document 5 describes improvement in sensitivity, resolution and exposure margin by addition of a sulfonic acid organic salt or a carboxylic acid organic salt. In these technologies, a strong acid generated from other photo acid generators by exposure (sulfonic acid) is exchanged with an acidulous onium salt to produce weak acid and strong acid onium salt. Accordingly, by substituting a strong acid of high acidity (sulfonic acid) with a weak acid (carboxylic acid), acid decomposition reaction of an acid-labile group is controlled to achieve a smaller (controlled) acid diffusion distance. Apparently, it functions as an acid diffusion control agent.

However, use of the-described resist composition containing a carboxylic acid onium salt or a fluorocarboxylic acid onium salt for patterning can cause a higher LER. Thus, development of an acid diffusion control agent capable of reducing LER has been desired.

PRIOR ART DOCUMENTS

Patent Documents

Patent Document 1: Japanese Patent Laid-Open Publication No. 2006-201532
Patent Document 2: Japanese Patent Laid-Open Publication No. 2006-215180
Patent Document 3: Japanese Patent Laid-Open Publication No. 2008-249762
Patent Document 4: Japanese Patent No. 3955384
Patent Document 5: Japanese Patent Laid-Open Publication No. H11-327143

SUMMARY OF THE INVENTION

The present invention has been accomplished to solve the above-mentioned problems, and an object thereof is to provide a chemically-amplified negative resist composition capable of improving the resolution for patterning and obtaining a pattern with reduced line edge roughness (LER).

To solve the above-mentioned problems, the present invention provides a chemically-amplified negative resist composition for high energy beam exposure comprising: (A) a salt represented by the following general formula (1); and (B) a resin containing one or more kinds of repeating units represented by the following general formulae (UN-1) and (UN-2),

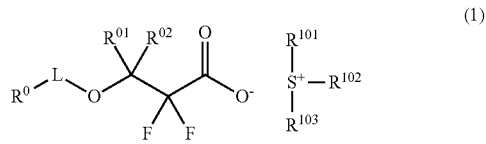

(1)

wherein $R^0$ represents a hydrogen atom, or a linear monovalent hydrocarbon group having 1 to 20 carbon atoms or a branched or a cyclic monovalent hydrocarbon group having 3 to 20 carbon atoms with which a hetero atom may be substituted or in which a hetero atom may be included; each $R^{O1}$ and $R^{O2}$ independently represents a hydrogen atom, or a linear monovalent hydrocarbon group having 1 to 20 carbon atoms or a branched or a cyclic monovalent hydrocarbon group having 3 to 20 carbon atoms with which a hetero atom may be substituted or in which a hetero atom may be included, and $R^{O1}$ and $R^{O2}$ may mutually be bonded to form a cyclic structure together with a carbon atom bonded by the same and a carbon atom between the same, and at least one of $R^O$, $R^{O1}$ and $R^{O2}$ has a cyclic structure; each $R^{101}$, $R^{102}$ and $R^{103}$ independently represents a linear monovalent hydrocarbon group having 1 to 20 carbon atoms or a branched or a cyclic monovalent hydrocarbon group having 3 to 20 carbon atoms with which a hetero atom may be substituted or in which a hetero atom may be included, and two or more of $R^{101}$, $R^{102}$ and $R^{103}$ may mutually be bonded to form a cyclic structure together with a sulfur atom in the formula; and L represents a single bond or any of an ester bond, a sulfonic acid ester bond, a carbonate bond and a carbamate bond each of which is formed together with an adjacent oxygen atom,

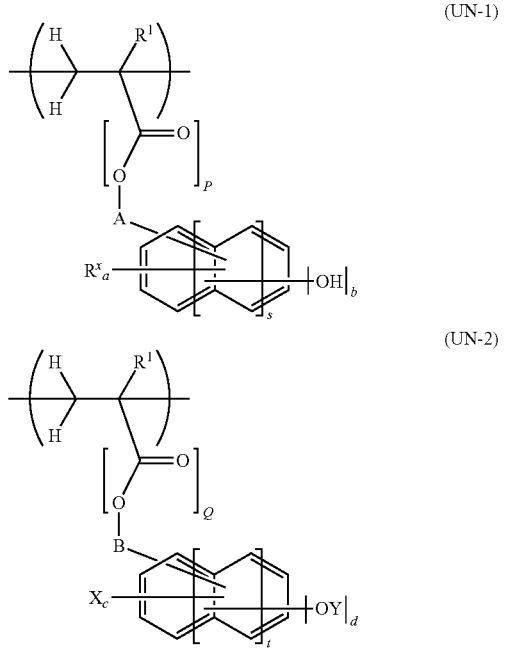

wherein each A and B represents a single bond or an alkylene group having 1 to 10 carbon atoms that may contain an ether bond in a chain of the alkylene group; each $R^1$ independently represents a hydrogen atom or a methyl group; $R^X$ represents a hydrogen atom or an alkyl group having 1 to 6 carbon atoms; X represents a hydrogen atom, a linear, a branched or a cyclic alkyl group, substituted or unsubstituted, having 1 to 20 carbon atoms, an alkoxyalkyl group having 2 to 20 carbon atoms, an alkylthioalkyl group having 2 to 20 carbon atoms, a halogen atom, a nitro group, a cyano group, a sulfinyl group, or a sulfonyl group; Y represents an alkyl group having 1 to 20 carbon atoms or an acyl group having 1 to 20 carbon atoms; "a" and "c" represent an integer of 0 to 4; "b" represents an integer of 1 to 5; "d" represents an integer of 0 to 5; P and Q represent 0 or 1; and "s" and "t" represent an integer of 0 to 2.

The resist composition can effectively control acid diffusion by exposure in patterning by action of the salt, and improve the resolution and obtain a pattern with a reduced LER when a pattern is formed by coating for a resist film. In addition, the above repeating unit can improve etching resistance and adhesiveness of a resist film to a substrate.

It is preferable that the resin further contain one or more kinds of repeating unit represented by the following general formulae (UN-3) and (UN-4),

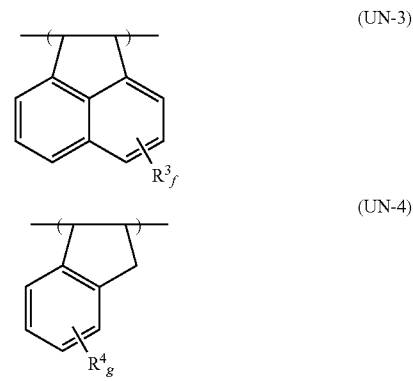

wherein "f" represents an integer of 0 to 6; $R^3$ represents any of a hydrogen atom, an alkyl group or a primary or a secondary alkoxy group having 1 to 6 carbon atoms that may be halogen-substituted, and an alkylcarbonyloxy group having 1 to 7 carbon atoms that may be halogen-substituted; "g" represents an integer of 0 to 4; and $R^4$ represents any of a hydrogen atom, an alkyl group or a primary or a secondary alkoxy group having 1 to 6 carbon atoms that may be halogen-substituted, and an alkylcarbonyloxy group having 1 to 7 carbon atoms that may be halogen-substituted.

The resist composition can improve etching resistance and electron beam irradiation resistance by action of the above repeating unit.

Also, the resist composition preferably contains an acid generator that generates a sulfonic acid by high energy beams exposure.

The resist composition can preferably be used as a chemically-amplified negative resist composition.

In addition, the resist composition preferably contains a crosslinking agent.

The resist composition can further improve dissolution contrast during development, and can suitably be used as a chemically-amplified negative resist composition.

Among these, it is preferable that as a basic component, one or more compound represented by the following general formulae (7) to (9) are further contained,

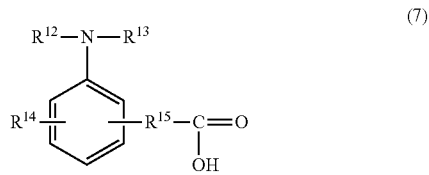

wherein each $R^{12}$ and $R^{13}$ represents a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, and $R^{12}$ and $R^{13}$ may be bonded to form a cyclic structure together with a nitrogen atom bonded by the same; $R^{14}$ represents a hydrogen atom, a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, a branched or a cyclic alkylene group having 1 to 20 carbon atoms, or an arylene group having 6 to 20 carbon atoms,

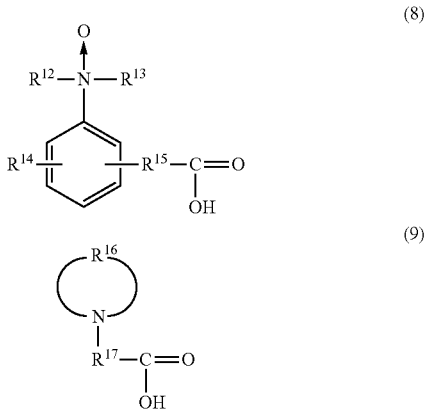

wherein $R^{12}$, $R^{13}$, $R^{14}$ and $R^{15}$ are the same as before; $R^{16}$ represents a linear or a branched alkylene group having 2 to 20 carbon atoms that can be substituted, and one or more of a carbonyl group, an ether group, an ester group, and sulfide may be contained between carbons of the alkylene group; $R^{17}$ represents a linear, a branched or a cyclic alkylene group having 1 to 20 carbon atoms, or an arylene group having 6 to 20 carbon atoms.

The resist composition can provide a pattern having good pattern profile with reduced LER, even when a substrate to be processed composed of a material that readily affects a resist pattern profile is used.

Further, the present invention provides a resist patterning process comprising steps of: applying the above resist composition on a substrate to be processed to obtain a resist film; pattern-exposing by a high energy beam; and developing by using an alkaline developer to obtain a resist pattern.

In the resist patterning process, acid diffusion during exposure can be effectively controlled by action of the salt contained in the resist composition. Therefore, a pattern having excellent resolution with reduced LER can be formed on a resist film.

At this time, an EUV or an electron beam is preferably used as the high energy beam.

In such a manner, a finer pattern can be formed on a resist film.

At this time, a top surface of the substrate to be processed is preferably composed of a material containing chrome.

Also, a photo mask blank is preferably used as the substrate to be processed.

Accordingly, the resist patterning process of the present invention can obtain a pattern having good pattern profile with reduced LER, even by using a substrate to be processed (e.g. a photo mask blank) whose top surface is composed of a material that readily affects a resist pattern profile such as a material containing chrome.

The chemically-amplified negative resist composition of the present invention can effectively control a diffusion of an acid generated by exposure, and obtain a pattern having an extremely high resolution with reduced LER in patterning. In addition, the inventive resist patterning process using the above chemically-amplified negative resist composition enables a pattern having high resolution with reduced LER to be formed, resulting in preferable availability in fine processing technique, particularly in EUV and EB lithography.

DETAILED DESCRIPTION OF THE PREFERRED EMBODIMENTS

The present inventors diligently conducted study on the above problem and consequently found that a pattern having small LER can be obtained when a resist composition includes the salt represented by the above general formula (1), thereby bringing the present invention to completion.

The present invention will be described in detail. In the following description, some chemical structures represented by chemical formulae contain an asymmetric carbon, thus including an enantiomer and a diastereomer. In this case, these isomers are collectively represented by one common formula. These isomers may be used alone or as a mixture.

The present invention provides a chemically-amplified negative resist composition containing a salt represented by the following general formula (1).

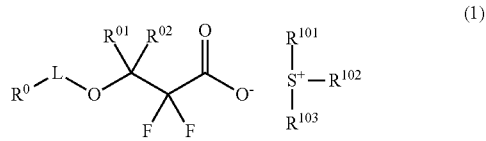

$R^0$ in the general formula (1) represents a hydrogen atom, or a linear monovalent hydrocarbon group having 1 to 20 carbon atoms or a branched or a cyclic monovalent hydrocarbon group having 3 to 20 carbon atoms with which a hetero atom may be substituted or in which a hetero atom may be included.

Illustrative example of $R^0$ includes a methyl group, an ethyl group, a propyl group, an isopropyl group, an n-butyl group, a sec-butyl group, a tert-butyl group, a tert-amyl group, an n-pentyl group, an n-hexyl group, an n-octyl group, an n-nonyl group, an n-decyl group, a cyclopentyl group, a cyclohexyl group, a 2-ethylhexyl group, a cyclopentylmethyl group, a cyclopentylethyl group, a cyclopentylbutyl group, a cyclohexylmethyl group, a cyclohexylethyl group, a cyclohexylbutyl group, a norbornyl group, a tricyclo[5.2.1.0$^{2,6}$]decanyl group, an adamantyl group, an adamantylmethyl group, a phenyl group, a naphthyl group, and an anthracenyl group. A part of hydrogen atoms of these groups may be substituted with a hetero atom such as oxygen atom, sulfur atom, nitrogen atom and halogen atom, or a hetero atom such as oxygen atom, sulfur atom and nitrogen atom may be included. Specifically, a hydroxy group, a cyano group, a carbonyl group, an ether bond, an ester bond, a sulfonic acid ester bond, a carbonate bond, a lactone ring, a sultone ring, a carboxylic anhydride, a haloalkyl group and so on may be formed or included.

$R^{01}$ and $R^{02}$ in the general formula (1) independently represents a hydrogen atom, or a linear monovalent hydrocarbon group having 1 to 20 carbon atoms or a branched or a cyclic monovalent hydrocarbon group having 3 to 20 carbon atoms with which a hetero atom may be substituted or in which a hetero atom may be included, and $R^{01}$ and $R^{02}$ may mutually be bonded to form a cyclic structure together with a carbon atom bonded by the same and a carbon atom between the same.

As for $R^{01}$ and $R^{02}$, a monovalent hydrocarbon group can be illustrated as shown in illustrative example of $R^0$. When $R^{01}$ and $R^{02}$ are mutually bonded to form a cyclic structure together with a carbon atom bonded by the same and a carbon atom between the same, illustrative example of a formed cyclic substituent includes a cyclopentyl group, a cyclohexyl group, a norbornyl group, and an adamantyl group, and part of hydrogen atoms of these groups may be substituted with a hetero atom such as oxygen atom, sulfur atom, nitrogen atom, and halogen atom, or a hetero atom such as oxygen atom, sulfur atom, and nitrogen atom may be included. Specifically, a hydroxy group, a cyano group, a carbonyl group, an ether bond, an ester bond, a sulfonic acid ester bond, a carbonate bond, a lactone ring, a sultone ring, a carboxylic anhydride, a haloalkyl group and so on may be formed or included.

In addition, at least one of $R^0$, $R^{01}$ and $R^{02}$ has a cyclic structure. Illustrative example of a cyclic group includes a cyclopentyl group, a cyclohexyl group, a norbornyl group, a tricyclo[5.2.1.0$^{2,6}$]decanyl group, an adamantyl group, a phenyl group, a naphthyl group, and an anthracenyl group, and part of hydrogen atoms of these groups may be substituted with a hetero atom such as oxygen atom, sulfur atom, nitrogen atom, and halogen atom, or a hetero atom such as oxygen atom, sulfur atom, and nitrogen atom may be included. Specifically, a hydroxy group, a cyano group, a carbonyl group, an ether bond, an ester bond, a sulfonic acid ester bond, a carbonate bond, a lactone ring, a sultone ring, a carboxylic anhydride, a haloalkyl group and so on may be formed or included. Illustrative example of the preferable cyclic group includes an alicyclic hydrocarbon group.

L in the general formula (1) represents a single bond or any of an ester bond, a sulfonic acid ester bond, a carbonate bond and a carbamate bond each of which is formed together with an adjacent oxygen atom.

Illustrative example of a preferable structure at an anion portion of a sulfonium salt represented by the general formula (1) is shown as follows.

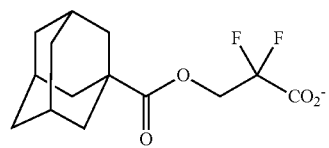
(A-1)

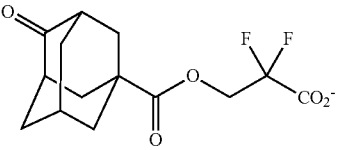
(A-2)

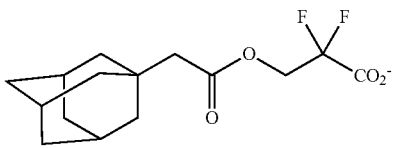
(A-3)

-continued

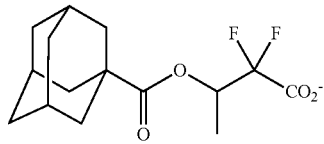
(A-4)

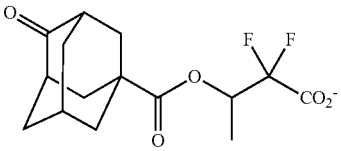
(A-5)

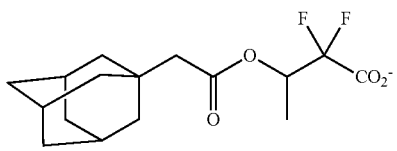
(A-6)

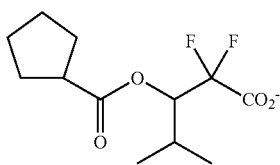
(A-7)

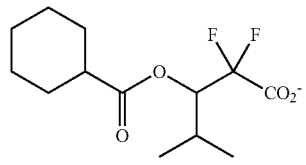
(A-8)

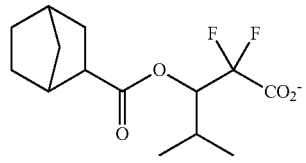
(A-9)

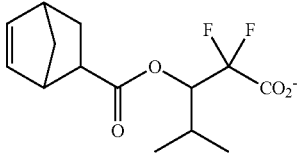
(A-10)

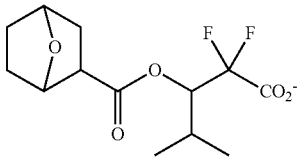
(A-11)

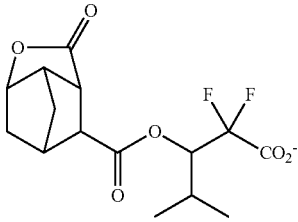
(A-12)

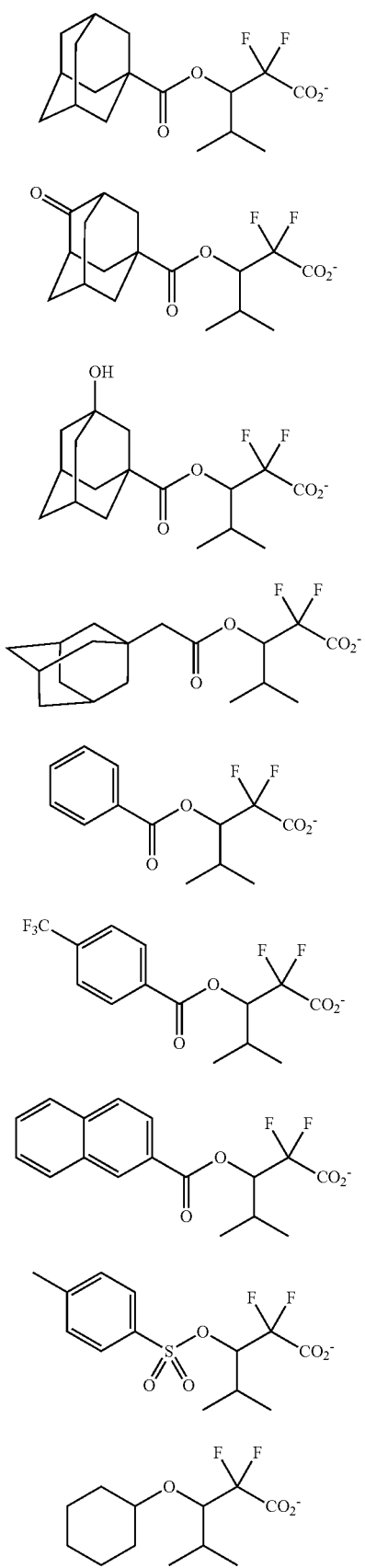
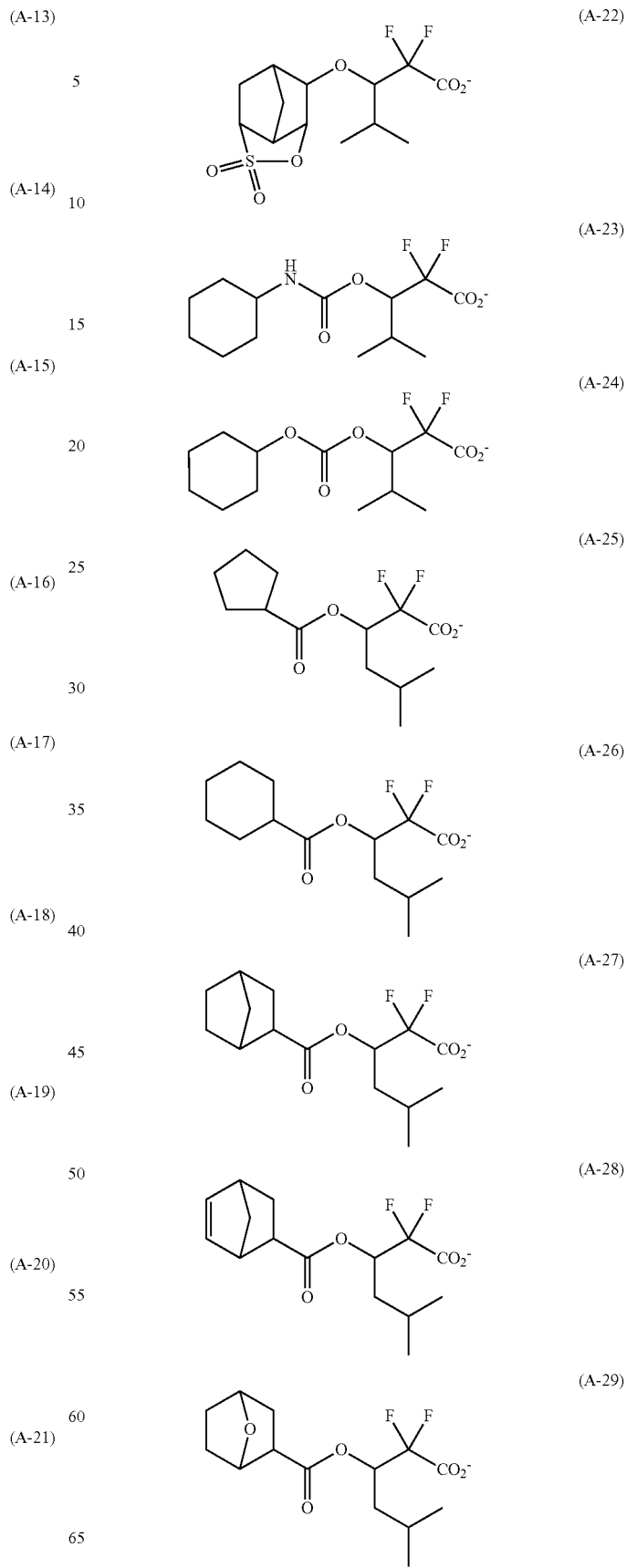

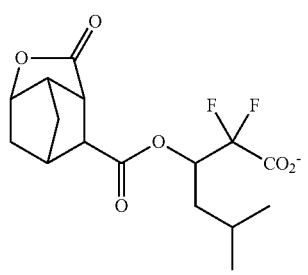
(A-30)
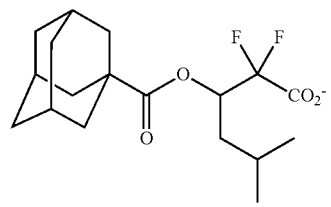
(A-31)
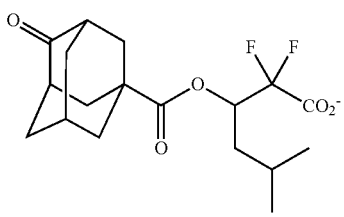
(A-32)
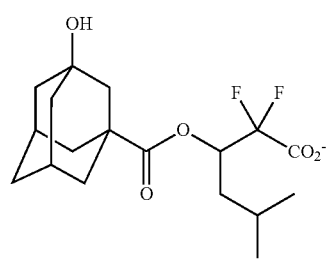
(A-33)
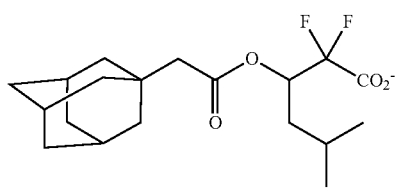
(A-34)
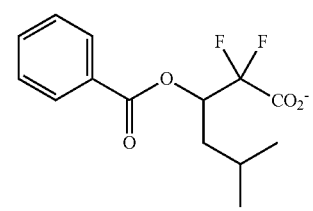
(A-35)
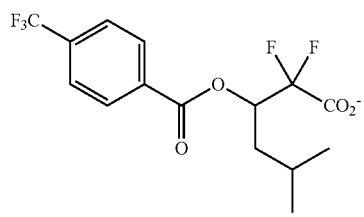
(A-36)
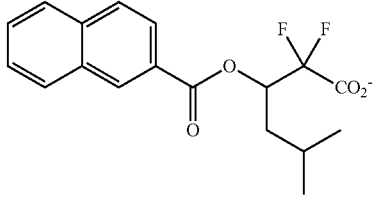
(A-37)
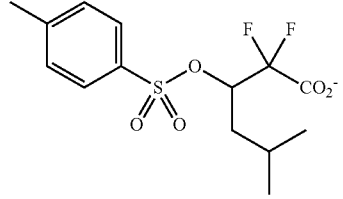
(A-38)
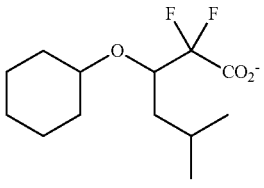
(A-39)
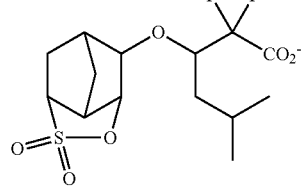
(A-40)
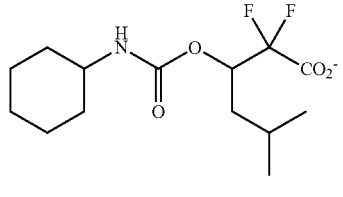
(A-41)
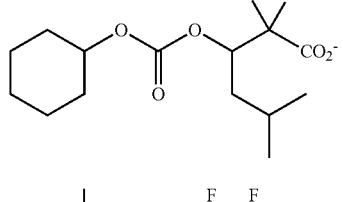
(A-42)
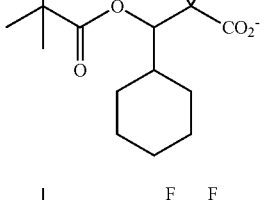
(A-43)
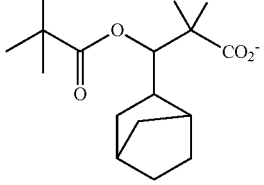
(A-44)

(A-45) 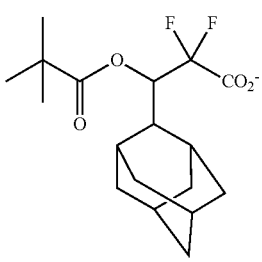

(A-46) 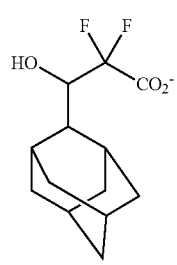

(A-47) 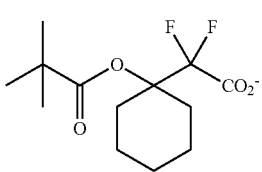

(A-48) 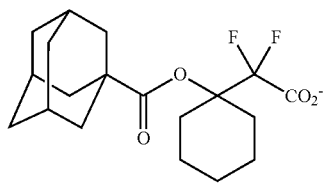

(A-49) 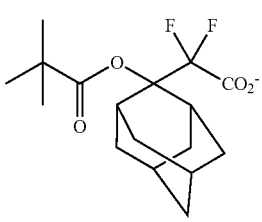

(A-50) 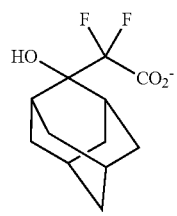

(A-51) 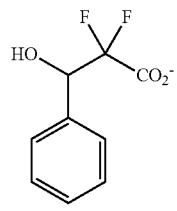

(A-52) 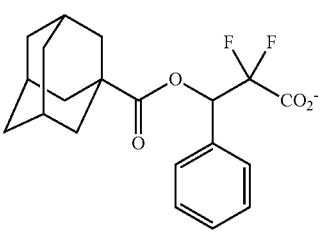

(A-53) 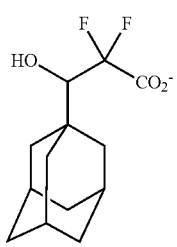

Among the above, structures (A-9) to (A-16), (A-27) to (A-34), (A-44) to (A-50), (A-52), and (A-53) are preferable anion portion of a sulfonium salt. The sulfonium salt having these structures as anion exhibits high lipid-solubility despite a carboxylate, and provides suppressed acid diffusion due to rigid structure with bicyclo ring or tricycle ring. Therefore, such a sulfonium salt is desirable for a resist composition.

In the general formula (1), each $R^{101}$, $R^{102}$ and $R^{103}$ independently represents a linear monovalent hydrocarbon group having 1 to 20 carbon atoms or a branched or a cyclic monovalent hydrocarbon group having 3 to 20 carbon atoms with which a hetero atom may be substituted or in which a hetero atom may be included, and two or more of $R^{101}$, $R^{102}$ and $R^{103}$ may mutually be bonded to form a cyclic structure together with a sulfur atom in the formula.

Illustrative example of $R^{101}$, $R^{102}$ and $R^{103}$ includes an alkyl group such as a methyl group, an ethyl group, an n-propyl group, an isopropyl group, an n-butyl group, a tert-butyl group, a cyclopropyl group, a cyclopentyl group, a cyclohexyl group, a cyclopropylmethyl group, a 4-methylcyclohexyl group, a cyclohexylmethyl group, a norbornyl group, and an adamantyl group; an alkenyl group such as a vinyl group, an allyl group, a propenyl group, a butenyl group, a hexenyl group, and a cyclohexenyl group; an aryl group such as a phenyl group, a naphthyl group, and a thienyl group; and an aralkyl group such as a benzyl group, 1-phenylethyl group, and 2-phenylethyl group, and preferably an aryl group. Part of hydrogen atoms of these groups may be substituted with a hetero atom such as oxygen atom, sulfur atom, nitrogen atom, and halogen atom, or a hetero atom such as oxygen atom, sulfur atom, and nitrogen atom may be included. Specifically, a hydroxy group, a cyano group, a carbonyl group, an ether bond, an ester bond, a sulfonic acid ester bond, a carbonate bond, a lactone ring, a sultone ring, a carboxylic anhydride, a haloalkyl group and so on may be formed or included.

Illustrative example of a structure obtained after two of $R^{101}$, $R^{102}$ and $R^{103}$ are mutually bonded to form a cyclic structure together with a sulfur atom in the formula includes groups represented by the following formulae.

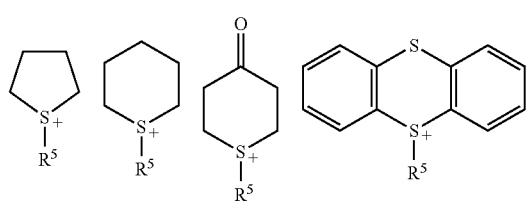
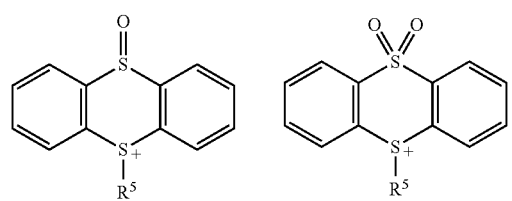
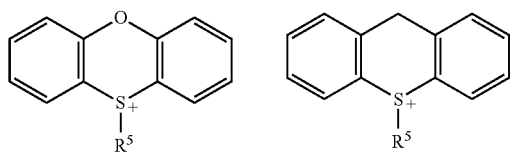
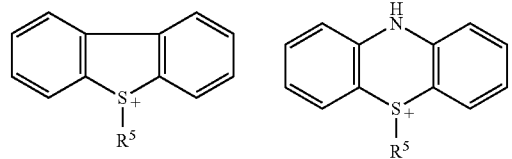
In the above formula, $R^5$ represents the same as groups illustrated as the $R^{101}$, $R^{102}$ and $R^{103}$.
Illustrative example of a structure at a cation portion of the sulfonium salt represented by the general formula (1) is shown as follows, but the present invention is not limited thereto.
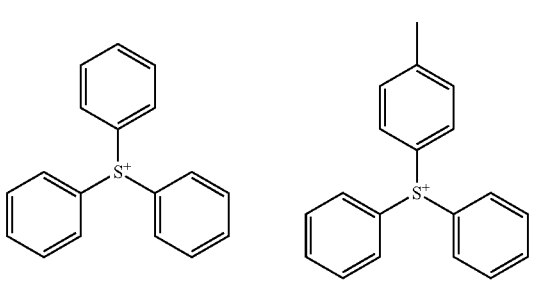
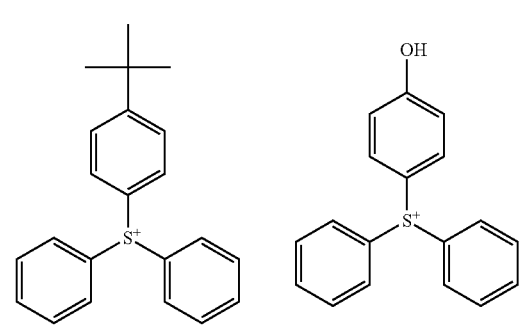
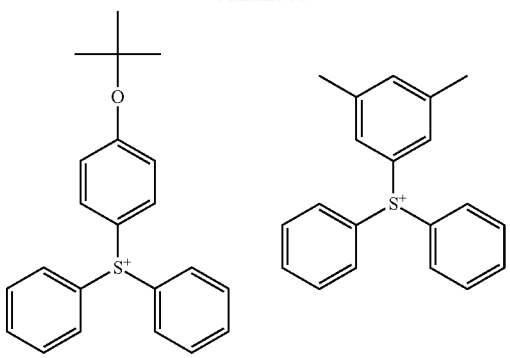
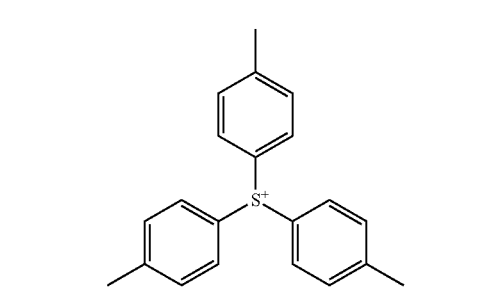
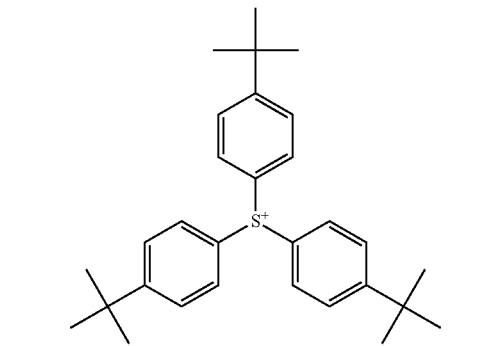
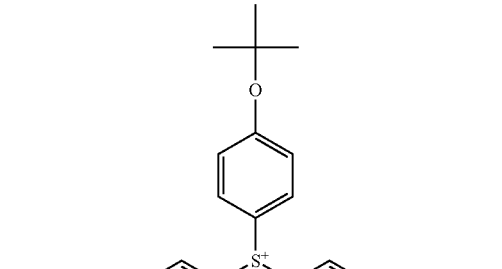
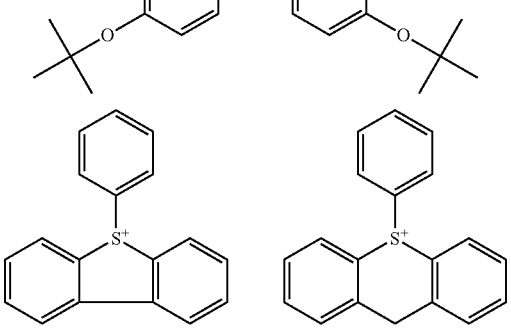

-continued

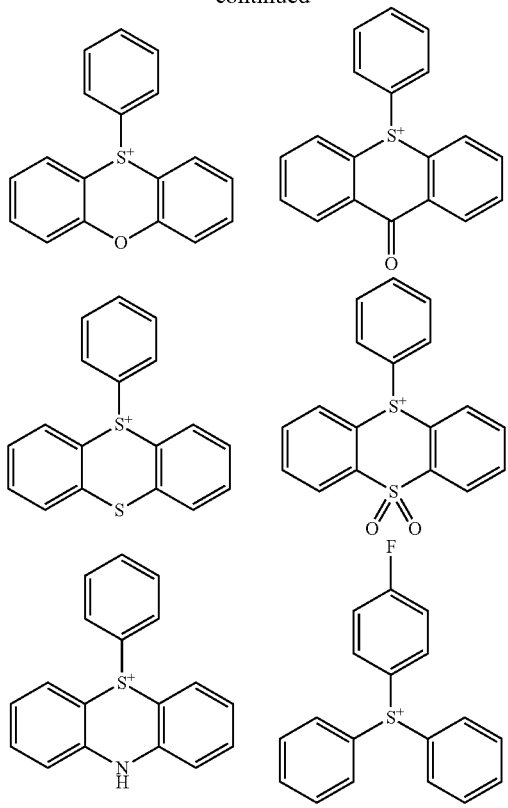

Illustrative example of a structure of the sulfonium salt of the present invention includes the ones obtained by an optional combination of the above-described anion and cation.

The sulfonium salt represented by the above general formula (1) of the present invention acts as an acid diffusion control agent. Specifically, coexistence of the salt represented by the general formula (1) and a strong acid generating onium salt that generates an acid whose acidity is relatively higher than that of an acid generated from the salt of the present invention will produce a corresponding carboxylic acid and a strong acid by photo exposure. Meanwhile, much undecomposed onium salt is found at a portion subjected to a small exposure does. A strong acid acts as a catalyst to activate an active site of crosslinking agent or polymer, while carboxylic acid generated from the salt represented by the general formula (1), which is acidulous, slightly contribute to activation of an active site. The strong acid performs ion exchange with a residual carboxylic acid sulfonium salt, which will be turned into an onium salt of the strong acid to release a carboxylic acid instead. In other words, resulting ion exchange neutralizes the strong acid with a carboxylic acid sulfonium salt. This is probably because the carboxylic acid sulfonium salt of the present invention functions as a quencher.

The onium salt type quencher can usually reduce Line Width Roughness (LWR) of a resist pattern, compared to a quencher using an amine compound. The reason is not clearly identified, but it is assumed as follows. A site for a strong acid to be generated at the end of exposure is different from a site where a strong acid generating onium salt initially exists by numerously repeated salt exchange between the strong acid and the carboxylic acid sulfonium salt. It is assumed that a repeated cycle of photo acid generation and salt-exchange averages acid generation points, resulting in a smaller LWR of a resist pattern after development.

The salt of the present invention can also act as an acid generator. As described above, an acid generated from the carboxylic acid sulfonium salt of the present invention can slightly contribute to activation of an active site. Consequently, if no salt whose acid strength is higher than that of an acid generated from the salt of the present invention exists, the salt of the present invention itself can function as an acid generator to cause a negative reaction. In this case, however, resulting lowered resist sensitivity can lead to a favorable use of patterning accordingly.

It is preferable that the acidity of an acid generated from an onium salt (pKa) be in the range of 1.0 to 4.0, and the range of 1.0 to 3.5 is more preferable. If the pKa is 1.0 or more, the salt can preferably be used as an acid diffusion control agent. If the pKa is 4.0 or less, the difference in pKa with an acid generated from a photo acid generator becomes appropriate and the roughness can be reduced by the above-described exchange reaction between an acid and an onium salt.

Generally, when a chemically-amplified negative resist composition is prepared, it is preferable that the resist composition contain a polymer, as a base resin, that is provided with a larger molecular weight by reaction with a crosslinking agent by action of an acid.

A polymer used as a base resin of the inventive chemically-amplified negative resist composition is a resin containing one or more kinds of repeating unit represented by the following general formulae (UN-1) and (UN-2).

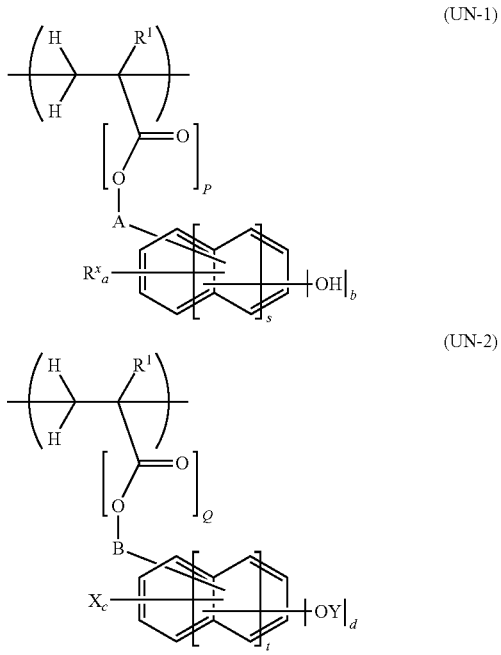

wherein each A and B represents a single bond or an alkylene group having 1 to 10 carbon atoms that may contain an ether bond in a chain of the alkylene group; each $R^1$ independently represents a hydrogen atom or a methyl group; Rx represents a hydrogen atom or an alkyl group having 1 to 6 carbon atoms; X represents a hydrogen atom, a linear, a branched or a cyclic alkyl group, substituted or unsubstituted, having 1 to 20 carbon atoms, an alkoxyalkyl group having 2 to 20 carbon atoms, an alkylthioalkyl group having 2 to 20 carbon atoms, a halogen atom, a nitro group, a cyano group, a sulfinyl group, or a sulfonyl group; Y represents an alkyl group having 1 to 20 carbon atoms or an acyl group having 1 to 20 carbon atoms; "a" and "c" represent an integer of 0 to 4; "b" represents an integer of 1 to 5; "d" represents an integer of 0 to 5; P and Q represent 0 or 1; and "s" and "t" represent an integer of 0 to 2.

The repeating unit represented by the above general formula (UN-1) is a repeating unit that provides etching resistance, and adhesiveness to a substrate and solubility to an alkaline developer. A in the above general formula (UN-1) represents a single bond or an alkylene group having 1 to 10 carbon atoms that may contain an ether bond in a chain of the alkylene group.

Illustrative example of a preferable alkylene group includes a methylene group, an ethylene group, a propylene group, a butylene group, a pentylene group, a hexylene group, and a structural isomer of a branched or a cyclic carbon skeleton. If the alkylene group contains an ether bond and P in the general formula (UN-1) represents 0, an atom bonded to a main chain is an ether oxygen, and a second ether bond may be placed on any site other than a site between a carbon atom at α position and a carbon atom at β position with respect to the ether oxygen. Also, if P represents 1, an ether bond may be placed on any site other than a site between a carbon atom at α position and a carbon atom at β position with respect to an ester oxygen. If the number of carbon atoms of the above alkylene group is over 10, solubility to an alkaline developer unfavorably declines.

$R^X$ in the above general formula (UN-1) represents a hydrogen atom, or an alkyl group having 1 to 6 carbon atoms. Illustrative example of a preferable alkyl group having 1 to 6 carbon atoms includes a methyl group, an ethyl group, a propyl group, an isopropyl group, a butyl group, a pentyl group, a hexyl group, and a structural isomer of a branched or a cyclic carbon skeleton. If the number of carbon atoms is over 6, solubility to an alkaline developer unfavorably declines.

"a" represents an integer of 0 to 4, and "b" represents an integer of 1 to 5. "s" represents an integer of 0 to 2. If "s" represents 0, 1 or 2, the skeleton is benzene, naphthalene, or anthracene, respectively. If "s" represents 0, it is preferable that "a" represents an integer of 0 to 3 and "b" represents an integer of 1 to 3. If "s" represents 1 or 2, it is preferable that "a" represents an integer of 0 to 4 and "b" represents an integer of 1 to 5.

Illustrative example of a preferable repeating unit represented by the above general formula (UN-1) whose P represents 0 and A represents a single bond, or a repeating unit without a linker in which an aromatic cyclic is directly bonded to a main chain of a polymer (a unit derived from a monomer in which a 1-X-substituted or unsubstituted vinyl group is bonded to an aromatic ring substituted with a hydroxyl group, as typified by hydroxystyrene unit) includes 3-hydroxystyrene, 4-hydroxystyrene, 5-hydroxy-2-vinyl naphthalene, and 6-hydroxy-2-vinyl naphthalene.

Also, the repeating unit whose P represents 1, or the repeating unit having an ester skeleton as a linker is a vinyl monomer unit substituted with a carbonyl group, as typified by (meth)acrylic acid ester.

Illustrative example of the preferable general formula (UN-1) having a (meth)acrylic acid ester derived linker (—CO—O—A-) will be shown as follows.

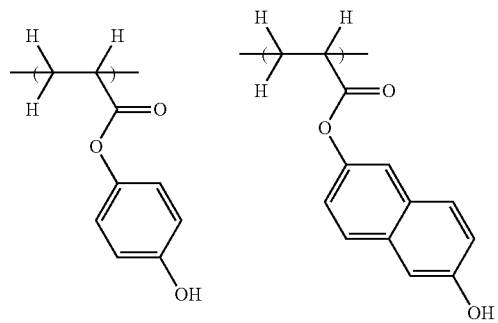
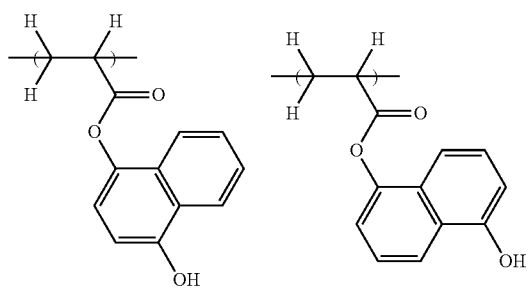
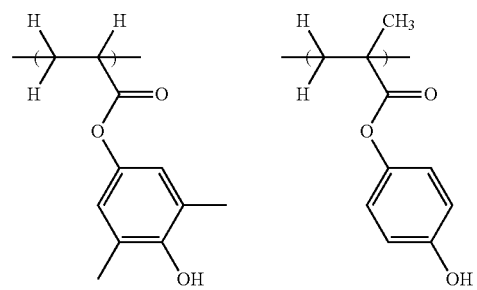
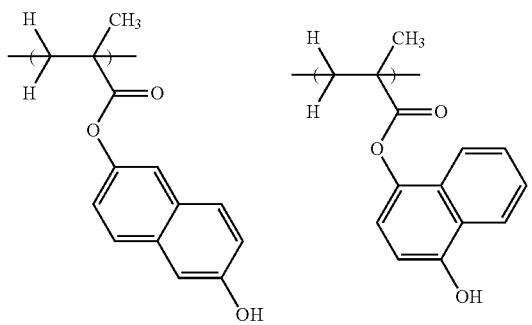
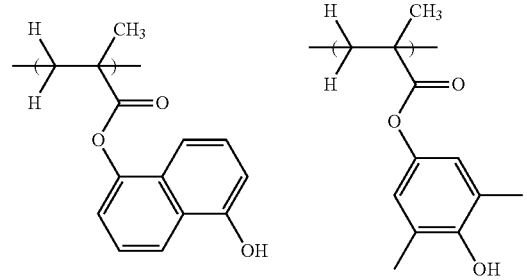

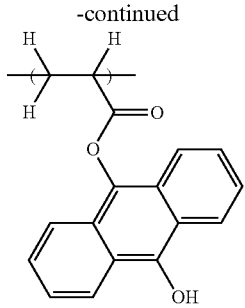

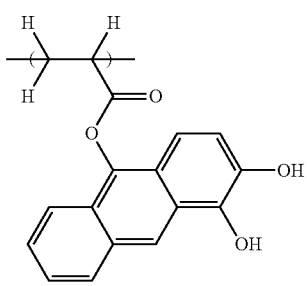

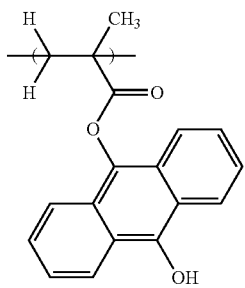

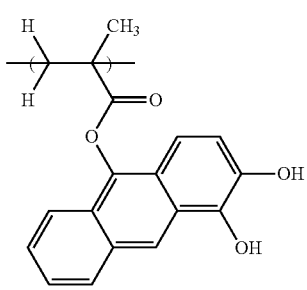

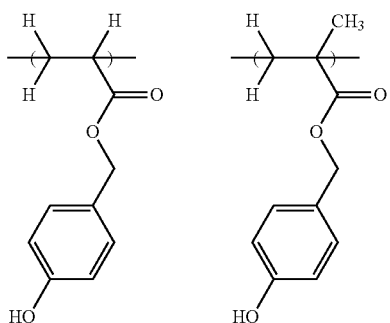

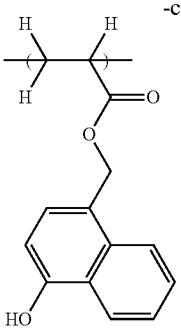

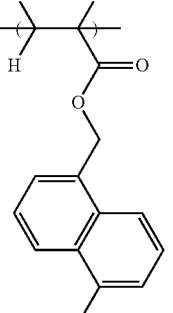

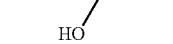

The repeating unit represented by the general formula (UN-2) is a repeating unit that provides etching resistance and controls solubility to an alkaline developer. B in the above general formula (UN-2) represents a single bond or an alkylene group having 1 to 10 carbon atoms that may contain an ether bond in a chain of the alkylene group.

Illustrative example of a preferable alkylene group includes a methylene group, an ethylene group, a propylene group, a butylene group, a pentylene group, a hexylene group, and a structural isomer of a branched or a cyclic carbon skeleton. If the alkylene group contains an ether bond and Q in the general formula (UN-2) represents 0, an atom bonded to a main chain is an ether oxygen, and a second ether bond may be placed on any site other than a site between a carbon atom at α position and a carbon atom at β position with respect to the ether oxygen. If Q represents 1, an ether bond may be placed on any site other than a site between a carbon atom at α position and a carbon atom at β position with respect to an ester oxygen. If the number of carbon atoms of the above alkylene group is over 10, solubility to an alkaline developer is unfavorably declines.

X shown in the general formula (UN-2) represents a hydrogen atom, a linear, a branched or a cyclic alkyl group, substituted or unsubstituted, having 1 to 20 carbon atoms, an alkoxyalkyl group having 2 to 20 carbon atoms, preferably having 2 to 10 carbon atoms, an alkylthioalkyl group having 2 to 20 carbon atoms, preferably 2 to 10 carbon atoms, a halogen atom, a nitro group, a cyano group, a sulfinyl group, or a sulfonyl group. Illustrative example of a preferable substituent includes a hydrogen atom; halogen atom such as a chlorine atom, bromine atom, and iodine atom; and alkyl group such as a methyl group, an ethyl group, a propyl group, a butyl group, a pentyl group, a hexyl group and structural isomer thereof, a cyclopentyl group, and a cyclohexyl group. If the number of carbon atoms is over 20, solubility to an alkaline developer as a base polymer significantly declines, resulting in a potential scum (development defect). In addition, illustrative example of the above described preferable substituent usefully used particularly as a monomer to be prepared includes a hydrogen atom, a chlorine atom, a bromine atom, an iodine atom, a methyl group, and an ethyl group.

In addition, Y shown in the general formula (UN-2) represents an alkyl group having 1 to 20 carbon atoms, preferably having 1 to 6, or an acyl group having 1 to 20 carbon atoms, preferably having 2 to 7 carbon atoms. If Y represents an alkyl group, OY represents an alkoxy group. If Y represents an acyl group, OY represents an acyloxy group. Illustrative example of a preferable alkoxy group includes a methoxy group, an ethoxy group, a propoxy group, a butoxy group, a pentyloxy group, a hexyloxy group and a structural isomer of its carbohydrate moiety, a cyclopentyloxy group, and a cyclohexyloxy group, and a methoxy group and an ethoxy group can particularly be useful. An acyloxy group can readily be introduced by a chemically-modified method even after polymerization of a polymer, and advantageously used to slightly adjust solubility of a base polymer to an alkaline developer. In this case, a methylcarbonyloxy group, an ethylcarbonyloxy group, a propylcarbonyloxy group, a butylcarbonyloxy group, a pentylcarbonyloxy group, a hexylcarbonyloxy group and its structural isomer, a cyclopentylcarbonyloxy group, a cyclohexylcarbonyloxy group, and a benzoyloxy group can favorably be used.

"c" represents an integer of 0 to 4, and "d" represents an integer of 0 to 5. "t" represents an integer of 0 to 2. If "t" represents 0, 1 or 2, the skeleton is benzene, naphthalene, or anthracene, respectively. If "t" represents 0, it is preferable that "c" represents an integer of 0 to 3 and "d" represents an integer of 0 to 3. If "t" represents 1 or 2, it is preferable that "c" represents an integer of 0 to 4 and "d" represents an integer of 0 to 5.

Illustrative example of a preferable basic skeleton of a repeating unit represented by the above general formula (UN-2) whose Q represents 0 and B represents a single bond, or a basic skeleton of a repeating unit without a linker in which an aromatic ring is directly bonded to main chain of a polymer (a monomer unit in which a 1-X-substituted or unsubstituted vinyl group is bonded to an aromatic ring substituted with the above X and/or OY, as typified a styrene skeleton) includes styrene, 4-chlorostyrene, 4-methylstyrene, 4-methoxystyrene, 4-bromostyrene, 4-(2-hydroxy-2-propyl) styrene, 2-vinyl naphthalene, and 3-vinyl naphthalene.

In addition, the repeating unit whose Q represents 1, or the repeating unit having an ester skeleton as a linker is a vinyl monomer unit substituted with a carbonyl group as typified (meth)acrylic acid ester.

Illustrative example of the preferable basic skeleton in the general formula (UN-2) having a (meth)acrylic acid ester derived linker (—CO—O—B—) will be shown as follows.

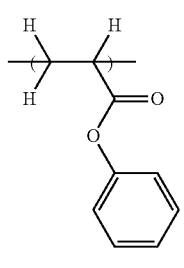
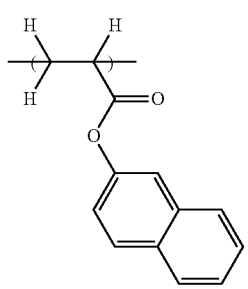

-continued

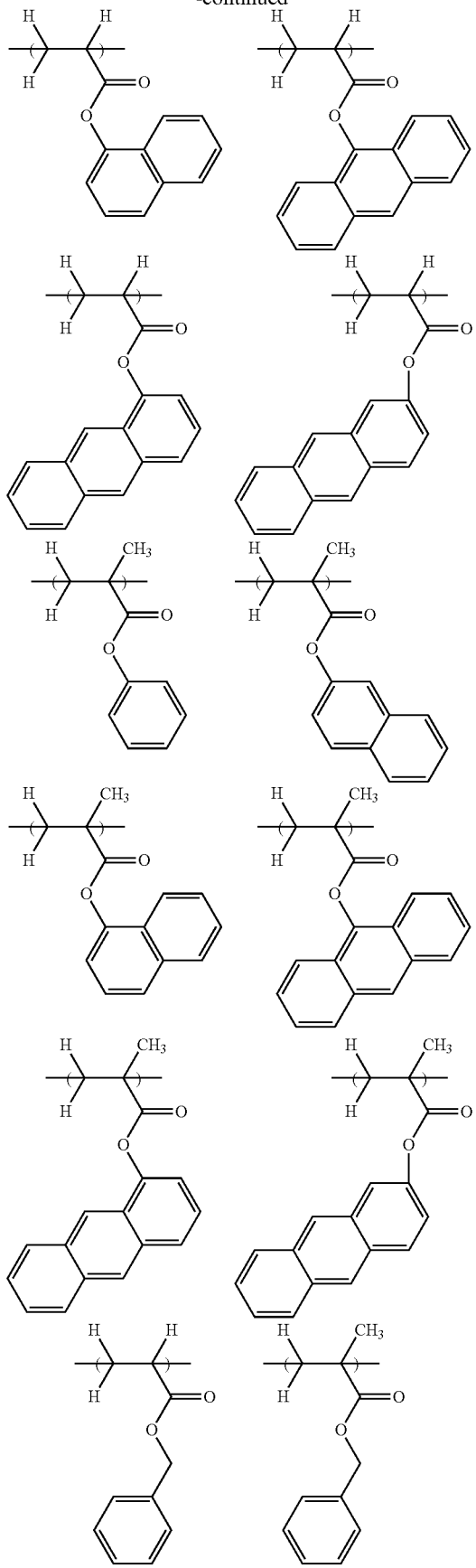

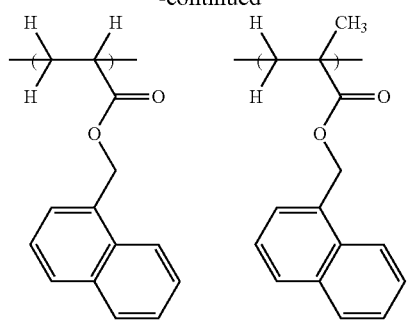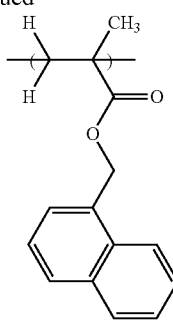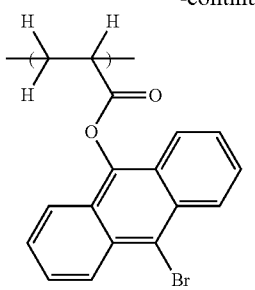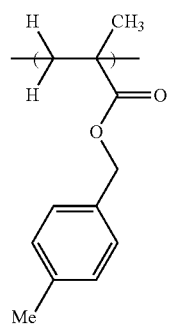
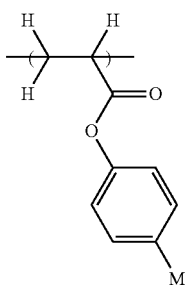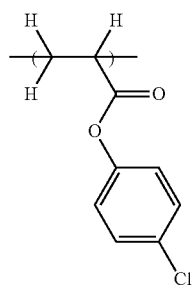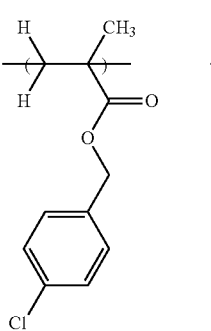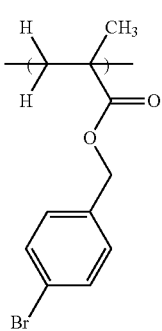
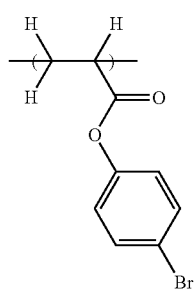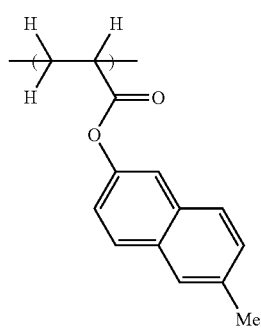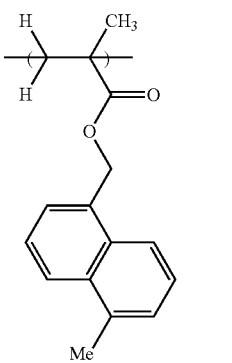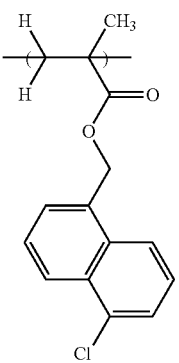
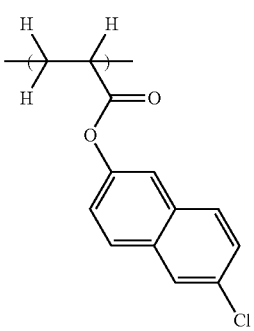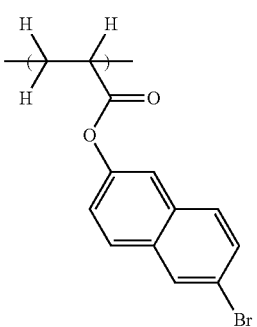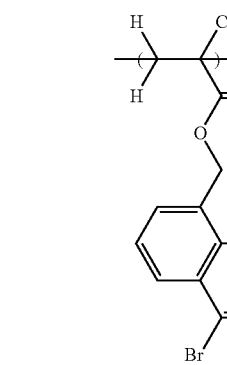
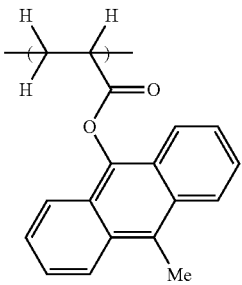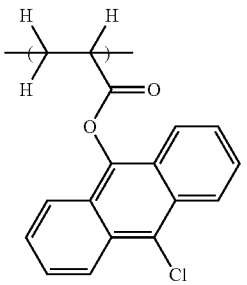
In the above formula, Me represents a methyl group.
In addition, a base resin used in the inventive resist composition is capable of containing one or more kinds of repeating unit represented by the following general formulae (UN-3) and (UN-4) as a main component unit of a polymer,

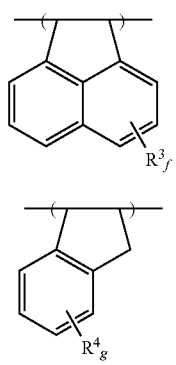

wherein "f" represents an integer of 0 to 6; $R^3$ represents any of a hydrogen atom, an alkyl group or a primary or a secondary alkoxy group having 1 to 6 carbon atoms that may be halogen-substituted, and an alkylcarbonyloxy group having 1 to 7 carbon atoms that may be halogen-substituted; "g" represents an integer of 0 to 4; and $R^4$ represents any of a hydrogen atom, an alkyl group or a primary or a secondary alkoxy group having 1 to 6 carbon atoms that may be halogen-substituted, and an alkylcarbonyloxy group having 1 to 7 carbon atoms that may be halogen-substituted.

When these repeating units (one or more kinds of repeating unit represented by the above general formulae (UN-3) and (UN-4)) are used as a constituent, electron beam exposure resistance can be improved during etching and pattern inspection by adding a cyclic structure to a main chain, in addition to etching resistance due to an aromatic ring.

A repeating unit represented by the above general formulae (UN-3) and (UN-4) that provides a cyclic structure to a main chain to improve etching resistance may be used singly, or in a combination of two or more kinds. It is preferable that in order to improve etching resistance, the amount of the repeating units to be introduced is 5 mol % or more, relative to total monomer units in the polymer.

As for a base resin used in the resist composition of the present invention, as a main component unit, a unit represented by the general formulae (UN-1) and (UN-2), and a unit that can be introduced represented by general formulae (UN-3) and (UN-4) is preferably in the range of 60 mol % or more, relative to the total monomer unit in the base resin. Accordingly, an advantageous property of the resist composition of the present invention can assuredly be obtained. More preferably, the units represented by the (UN-1) to (UN-4) are in the range of 70 mol % or more, particularly preferably in the range of 85 mol % or more, relative to the total monomer unit.

In addition, if the total component unit is a base resin composed of repeating units selected from (UN-1) to (UN-4), both high etching resistance and resolution are excellently achieved. As repeating unit other than (UN-1) to (UN-4), (meth)acrylic acid ester unit protected with an acid labile group and (meth)acrylic acid ester unit having adhesion group such as lactone structure, which are typically used as a repeating unit, can be used. A characteristic of a resist film may be slightly adjusted by other repeating units, but the base resin may contain none of these units.

A base resin used in the resist composition of the present invention can be obtained by copolymerization of corresponding monomers in known manner, if necessary, in a combination of protection reaction and deprotection reaction. The copolymerization is not particularly restricted, but preferably radical polymerization or anion polymerization. These manners can be performed based on Japanese Patent Laid-Open Publication No. 2004-115630.

Preferably, when a molecular weight of a base resin used in the resist composition of the present invention is measured by commonly used gel permeation chromatography (GPC) using polystyrene as a standard sample, the weight average molecular weight is preferably 2,000 to 50,000, more preferably 3,000 to 20,000. If the weight average molecular weight is 2,000 or more, as conventionally known, no round T-top of a pattern is formed, resolution is not reduced and LER does not deteriorate. Meanwhile, if the molecular weight becomes larger than the required amount, LER can grow according to a pattern to be resolved. Therefore, the molecular weight is preferably 50,000 or less, and when a pattern is formed with a pattern line width of 100 nm or less, the molecular weight is particularly preferably controlled to 20,000 or less.

For GPC measurement, a commonly used tetrahydrofuran (THF) solvent can be employed.

Moreover, it is preferable that the molecular weight distribution (Mw/Mn) of the polymer to be used in the chemically-amplified resist composition of the present invention is narrow distribution in the range of 1.0 to 2.0, and particularly 1.0 to 1.8. In this case, no extraneous substances are found on a pattern after development, or a pattern profile does not deteriorate.

The resist composition of the present invention preferably contains an acid generator to function as a chemically-amplified negative resist composition, e.g. a compound that generates an acid in response to an active ray or a radiation (photo acid generator). Any component of a photo acid generator is favorable so long as the compound generates an acid by high energy beam exposure. Illustrative example of the preferable photo acid generator includes sulfonium salt, iodonium salt, sulfonyldiazomethane, N-sulfonyloxyimide, and oxime-O-sulfonate acid generator. These can be used singly, or in a combination of two or more kinds. Illustrative example of the acid generator is described in paragraphs [0122] to [0142] of Japanese Patent Laid-Open Publication No. 2008-111103.

Among the above, illustrative example of the preferable acid generator includes an arylsulfonate photo acid generator in that it generates an acid having an appropriate acid strength for reacting the later-described crosslinking agent and polymer. Also, in order to improve LER by causing exchange reaction of the acid generated with an onium salt of the present invention, it is preferable that the pKa of an acid generated from a photo acid generator be in the range of −3.0 to 1.5, and more preferably in the range of −1.0 to 1.5.

A crosslinking agent can further be blended to the chemically-amplified resist composition of the present invention. Illustrative example of the crosslinking agent that can be used in the present invention includes: a melamine compound, a guanamine compound, a glycoluril compound or a urea compound each of which is substituted with at least one group selected from a methylol group, an alkoxymethyl group, and an acyloxymethyl group; an epoxy compound; an isocyanate compound; an azide compound; and a compound containing a double bond such as an alkenyl ether group. These may be used as an additive, and may be introduced on a polymer chain as a pendant group. Also, a compound containing a hydroxy group can also be used as a crosslinking agent.

Illustrative example of the melamine compound in the crosslinking agent includes a hexamethylol melamine, a hexamethoxymethyl melamine, a compound in which 1 to 6 methylol groups of hexamethylol melamine are subjected to methoxymethyl or its mixture, a hexamethoxyethyl melamine, a hexaacyloxymethyl melamine, and a compound in which 1 to 6 methylol groups of hexamethylol melamine are subjected to acyloxymethyl or its mixture.

Illustrative example of the guanamine compound includes a tetramethylol guanamine, a tetramethoxymethyl guanamine, a compound in which 1 to 4 methylol groups of tetramethylol guanamine are subjected to methoxymethyl or its mixture, a tetramethoxyethyl guanamine, a tetraacyloxy guanamine, and a compound in which 1 to 4 methylol groups of tetramethylol guanamine are subjected to acyloxymethyl and its mixture.

Illustrative example of the glycoluril compound includes a tetramethylol glycoluril, a tetramethoxy glycoluril, a tetramethoxymethyl glycoluril, a compound in which 1 to 4 methylol groups of tetramethylol glycoluril are subjected to methoxymethyl or its mixture, and a compound in which 1 to 4 methylol groups of tetramethylol glycoluril are subjected to acyloxymethyl or its mixture.

Illustrative example of the urea compound includes a tetramethylol urea, a tetramethoxymethyl urea, a compound in which 1 to 4 methylol groups of tetramethylol urea are subjected to methoxymethyl or its mixture, and tetramethoxyethyl urea.

Illustrative example of the epoxy compound includes tris(2,3-epoxy propyl) isocyanurate, trimethylolmethane triglycidylether, trimethylolpropane triglycidylether, and triethylolethane triglycidylether.

Illustrative example of the isocyanate compound includes tolylenediisocyanate, diphenylmethanediisocyanate, hexamethylenediisocyanate, and cyclohexanediisocyanate.

Illustrative example of the azide compound includes 1,1'-biphenyl-4,4'-bisazide, 4,4'-methylidenebisazide, and 4,4'-oxybisazide.

Illustrative example of the compound containing an alkenyl ether group includes ethylene glycol divinyl ether, triethylene glycol divinyl ether, 1,2-propanedioldivinyl ether, 1,4-butanedioldivinyl ether, tetramethylene glycol divinyl ether, neopentyl glycol divinyl ether, trimethylolpropanetrivinyl ether, hexanedioldivinyl ether, 1,4-cyclohexanedioldivinyl ether, pentaerythritoltrivinyl ether, pentaerythritoltetravinyl ether, sorbitoltetravinyl ether, sorbitolpentavinyl ether, and trimethylolpropanetrivinyl ether.

The amount of the crosslinking agent to be blended is preferably 0 to 50 parts by mass, more preferably 5 to 50 parts by mass, and much more preferably 10 to 30 parts by mass, relative to 100 parts by mass of a base resin, and can be used singly, or in a combination of two or more kinds. If the amount is 5 parts by mass or more, sufficient improvement in resolution can be obtained, and if the amount is 30 parts by mass or less, patterns are connected to cause less decrease in resolution.

An amine compound having a carboxyl group and not having a hydrogen atom covalently bonded to a base-center nitrogen atom may be contained in the resist composition of the present invention as a basic component. By blending this type of amine compound, change in pattern profile according to a material of a substrate to be processed can be prevented.

The pattern profile adjacent to a substrate changes according to a material of a substrate to be processed. This problem of a pattern depending on a substrate can cause a slight change in shape in connection with a finer target pattern. Particularly in processing of a photo mask blank, when patterning is performed on a chrome oxide nitride as a top surface material of a photo mask blank by using a chemically-amplified negative resist composition, a notch is caused on a pattern at the contact portion with the substrate (undercut).

This undercut problem can easily be found on a substrate whose surface material is a nitrogen compound such as TiN, SiN, and SiON, and particularly be found on a substrate whose surface material is a chromium metal compound such as a chromium metal and a chrome compound containing nitrogen and/or oxygen. Therefore, it is difficult to solve the undercut problem. However, by blending an amine compound having a carboxyl group and not having a hydrogen atom covalently bonded to a base-center nitrogen atom, the above-described undercut is prevented to form a favorable pattern profile even on a substrate whose top surface is composed of chrome compound, and the amine compound can advantageously be used in processing of a photo mask blank.

Illustrative example of a preferable amine compound having carboxyl group and not having a hydrogen atom covalently bonded to a base-center nitrogen atom described above includes the ones represented by the following general formulae (7) to (9), but are not restricted to these.

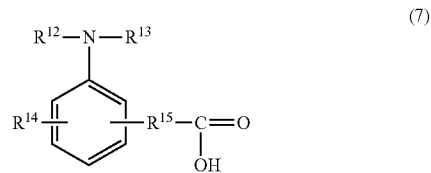

(7)

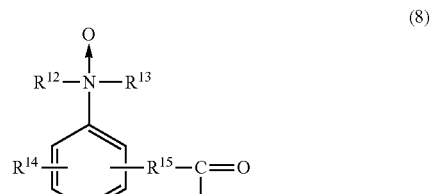

(8)

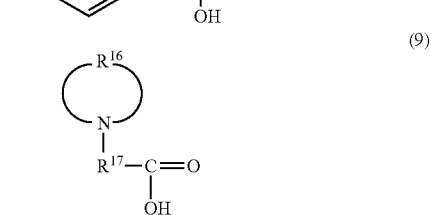

(9)

In the above general formulae, each $R^{12}$ and $R^{13}$ represents a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, and $R^{12}$ and $R^{13}$ may be bonded to form a cyclic structure together with a nitrogen atom bonded by the same; $R^{24}$ represents a hydrogen atom, a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, a branched or a cyclic alkylene group having 1 to 20 carbon atoms, or an arylene group having 6 to 20 carbon atoms; $R^{16}$ represents a linear or a branched alkylene group having 2 to 20 carbon atoms that can be substituted, and one or more of a carbonyl group (—CO—), an ether group (—O—), an ester group (—COO—), and sulfide (—S—) may be contained between carbons of the alkylene group; and $R^{17}$ represents a linear, a branched or a cyclic alkylene group having 1 to 20 carbon atoms, or an arylene group having 6 to 20 carbon atoms.

Illustrative example of the linear, branched or cyclic alkyl group having 1 to 20 carbon atoms in the above structural formulae includes a methyl group, an ethyl group, a propyl group, an isopropyl group, a butyl group, an isobutyl group, a t-butyl group, a pentyl group, a hexyl group, a decyl group, a cyclopentyl group, a cyclohexyl group, and a decahydronaphthalenyl group. Illustrative example of the aryl group having 6 to 20 carbon atoms includes a phenyl group, a naphthyl group, an anthryl group, a phenanthryl group, a pyrenyl group, a naphthacenyl group, and a fluorenyl group. Illustrative example of the aralkyl group having 7 to 20 carbon atoms includes a benzyl group, a phenethyl group, a phenylpropyl group, a naphthylmethyl group, a naphthylethyl group, an anthracenylmethyl group. Illustrative example of the hydroxyalkyl group having 2 to 20 carbon atoms, preferably having 2 to 10 carbon atoms includes a hydroxyethyl group, and a hydroxypropyl group. Illustrative example of the alkoxyalkyl group having 2 to 20 carbon atoms, preferably 2 to 10 carbon atoms includes a methoxymethyl group, an ethoxymethyl group, a propoxymethyl group, an isopropoxymethyl group, a butoxymethyl group, an isobutoxymethyl group, a t-butoxymethyl group, a t-amyloxymethyl group, a cyclohexyloxymethyl group, and a cyclopentyloxymethyl group. Illustrative example of the acyloxyalkyl group having 2 to 20 carbon atoms, preferably 2 to 10 carbon atoms includes a formyloxymethyl group, an acetoxymethyl group, a propionyloxymethyl group, a butyryloxymethyl group, a pivaloyloxymethyl group, a cyclohexanecarbonyloxymethyl group, and a decanoyloxymethyl group. Illustrative example of the alkylthioalkyl group having 2 to 20 carbon atoms, preferably 2 to 10 carbon atoms includes a methylthiomethyl group, an ethylthiomethyl group, a propylthiomethyl group, an isopropylthiomethyl group, a butylthiomethyl group, an isobutylthiomethyl group, a t-butylthiomethyl group, a t-amylthiomethyl group, a decylthiomethyl group, and a cyclohexylthiomethyl group, but are not restricted to these.

Illustrative example of the amine compound represented by the general formula (7) is shown as follows, but is not restricted to these.

O-dimethylaminobenzoic acid, p-dimethylaminobenzoic acid, m-dimethylaminobenzoic acid, p-diethylaminobenzoic acid, p-dipropylaminobenzoic acid, p-diisopropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalene acid, 3-diethylamino-2-naphthalene acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylamino phenylacetic acid, 4-dimethylamino phenylpropionic acid, 4-dimethylamino phenylbutyric acid, 4-dimethylamino phenylmalic acid, 4-dimethylamino phenylpyruvic acid, 4-dimethylamino phenyllactic acid, 2-(4-dimethylamino phenyl)benzoic acid, 2-(4-(dibutylamino)-2-hydroxybenzoyl)benzoic acid.

Illustrative example of the preferable amine oxide compound represented by the general formula (8) includes an oxidized product of the amine compound represented by the above general formula (7), but is not restricted to these.

Illustrative example of the preferable amine compound represented by the general formula (9) includes as follows, but is not restricted to these:

1-piperidinepropionic acid, 1-piperidinebutyric acid, 1-piperidinemalic acid, 1-piperidinepyruvic acid, and 1-piperidinelactic acid.

A surfactant conventionally used for improving the coating property may be added to the chemically-amplified resist composition of the present invention. When a surfactant is used, as many known examples are described in Japanese Patent Laid-Open Publication No. 2004-115630, the surfactant can be selected with reference thereto.

The amount of a surfactant to be added is preferably 2 mass parts or less, more preferably 1 mass part or less, and further preferably 0.01 mass part or more, relative to 100 mass parts of the base resin in the resist composition.

Further, the present invention provides a resist patterning process comprising steps of: applying the-described resist composition on a substrate to be processed to obtain a resist film; pattern-exposing by a high energy beam; and developing by using an alkaline developer to obtain a resist pattern.

To form a pattern by using the chemically-amplified resist composition of the present invention, known lithography method can be employed. Generally, the resist composition is applied on a substrate to be processed such as a substrate for manufacturing an integrated circuit (Si, $SiO_2$, SiN, SiON, TiN, WSi, BPSG, SOG, organic anti-reflection film, etc.) or a substrate for manufacturing a mask circuit (Cr, CrO, CrON, MoSi, etc.) by a method such as spin-coating so that the film is 0.03 to 2.0 μm thick, and pre-baked on a heated plate at 60 to 150° C. for 1 to 20 minutes, preferably at 80 to 140° C. for 1 to 10 minutes to form a resist film.

Next, by using a mask for forming a target pattern, or directly by beam exposure, a pattern is exposed so that the exposure does of a high energy beam such as an ultraviolet ray, a far-ultraviolet ray, an excimer laser, an electron beam, an EUV, an X ray, a y ray, a synchrotron radiation is 1 to 200 μC/cm², preferably 10 to 100 μC/cm². The chemically-amplified resist composition of the present invention is particularly effective in pattern-exposing by an EUV or an electron beam. For exposure, normal exposure method and Immersion method for immersing between a mask and a resist can be used. In this case, a water-insoluble top coat can be used.

Subsequently, the resist composition is subjected to post exposure bake (PEB) on a heated plate at 60 to 150° C. for 1 to 20 minutes, preferably at 80 to 140° C. for 1 to 10 minutes. Furthermore, the pattern is developed for 0.1 to 3 minutes, preferably for 0.5 to 2 minutes by means of a normal method such as dip method, puddle method and spray method, using a developer of an alkaline aqueous solution such as 0.1 to 5% by mass, preferably 2 to 3% by mass of tetramethyl ammonium hydroxide (TMAH) to form a target pattern on a substrate.

The resist composition of the present invention has durability against severe etching condition due to extremely high etching resistance, and is preferably used on the condition where small LER is required. Also, it is particularly useful for a substrate whose surface includes a material prone to pattern peel-off or pattern collapse since adhesiveness of a resist pattern is hard to control on a substrate to be processed, and particularly useful in patterning, on a substrate obtained by subjecting a chromium metal or a chrome compound containing 1 or more light element such as oxygen, nitrogen and carbon to sputtering coating on a top surface of the substrate, particularly on a photo mask blank.

EXAMPLES

The present invention will be described with reference to the Examples and Comparative Examples, but the present invention is not restricted to the following Examples. In the following Examples, Me represents a methyl group, copolymerization composition ratio is denoted by molar ratio, and weight average molecular weight (Mw) is denoted in terms of polystyrene according to gel permeation chromatography (GPC).

Synthesis Example 1

Synthesis of Carboxylic Acid Sulfonium Salt

Carboxylic acid sulfonium salt used in the present invention is synthesized by using the following prescription.

Synthesis Example 1-1

Synthesis of 1-adamantane carboxylic acid 1-(difluoromethoxycarbonylmethyl)-2-methylpropyl ester (Intermediate 1)

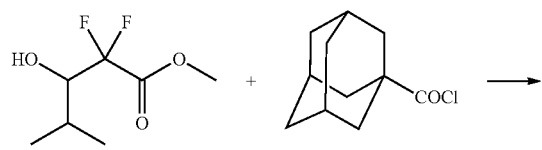

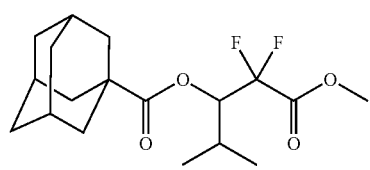

Methyl 2,2-difluoro-3-hydroxy-4-methyl pentanoate (16 g) and 1-adamantanecarbonyl chloride (19 g) synthesized according to a method described in Japanese Patent Laid-Open Publication No. 2012-97256 were dissolved in methylene chloride (100 g), and a mixed solution of triethyl amine (11 g), 4-dimethyl aminopyridine (1 g) and methylene chloride (20 g) was dropped into the obtained solution under ice cooling. After aging overnight, 5% by mass of hydrochloric acid was added to the product to quench the same, then a reaction solution was washed with water, and concentrated. Methylisobutyl ketone was added to the concentrated solution to be concentrated again and the concentrated solution was distilled to obtain a target compound, or 1-adamantane carboxylic acid 1-(difluoromethoxycarbonylmethyl)-2-methylpropyl ester (20 g) as a colorless oily matter (yield: 67%).

Synthesis Example 1-2

Synthesis of triphenylsulfonium 3-(adamantane-1-carbonyloxy)-2,2-difluoro-4-methyl pentanoate (Salt-1)

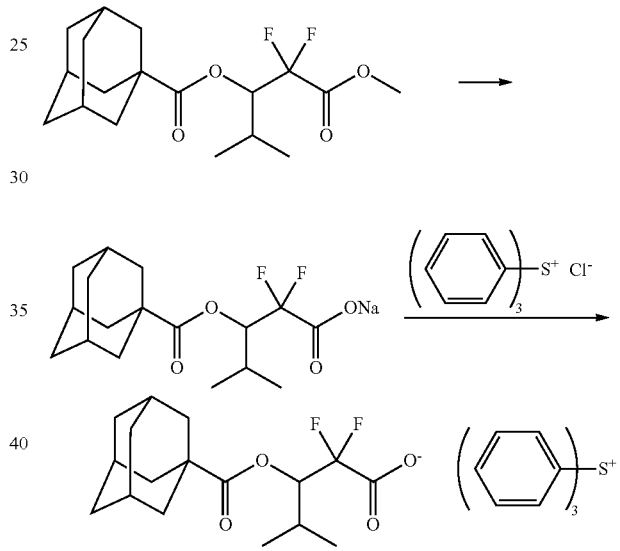

25% by mass of caustic soda (4.8 g) was added to a mixed solution of 1-adamantane carboxylic acid 1-(difluoromethoxycarbonylmethyl)-2-methylpropyl ester (10 g) prepared in Synthesis Example 1-1, 1,4-dioxane (50 g) and water (20 g), stirred for 2 hours, and then a reaction solution was washed with n-hexane to prepare an aqueous solution of sodium 3-(adamantane-1-carbonyloxy)-2,2-difluoro-4-methylpentanoate. An aqueous solution of triphenylsulfonium chloride (48 g) and methylene chloride (200 g) were added thereto, stirred for 30 minutes, and then an organic layer was isolated and washed with water, and thereafter was concentrated under reduced pressure. Methylisobutyl ketone was added to the concentrated solution to perform concentration again. Diisopropyl ether was added to the concentrated solution for crystallization, and a solid obtained was dried under reduced pressure to obtain a target compound, or triphenylsulfonium 3-(adamantane-1-carbonyloxy)-2,2-difluoro-4-methyl pentanoate (15 g) as a white crystal (yield: 86%).

Synthesis Example 1-3

Synthesis of 4-tert-butylphenyl diphenylsulfonium 3-(adamantane-1-carbonyloxy)-2,2-difluoro-4-methylpentanoate (Salt-2)

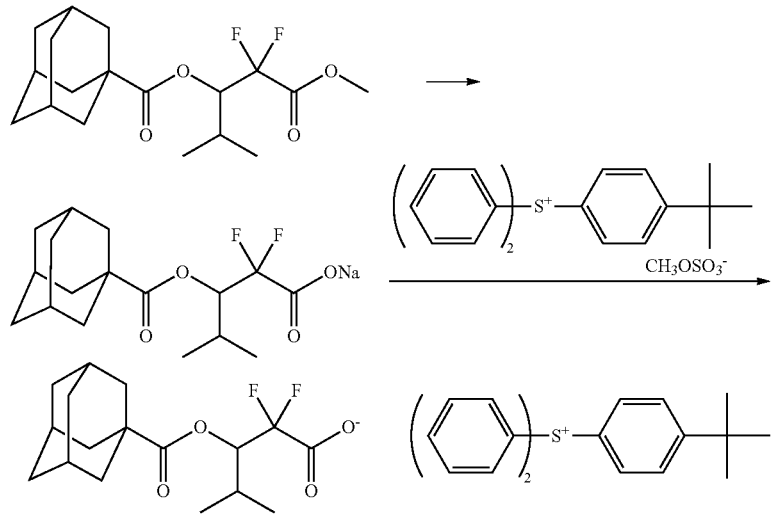

25% by mass of caustic soda (3.2 g) was added to a mixed solution of 1-adamantane carboxylic acid 1-(difluoromethoxycarbonylmethyl)-2-methyl-propyl ester (7 g) prepared in Synthesis Example 1-1, 1,4-dioxane (50 g) and water (20 g), stirred for 2 hours, and then a reaction solution was washed with n-hexane to prepare an aqueous solution of sodium 3-(adamantane-1-carbonyloxy)-2,2-difluoro-4-methylpentanoate. An aqueous solution of 4-tert-butylphenyldiphenylsulfonium methylsulfate (95 g) and methylene chloride (150 g) were added thereto, stirred for 30 minutes, and then an organic layer was isolated and washed with water, and thereafter was concentrated under reduced pressure. Methylisobutyl ketone was add to the concentrated solution, and to perform concentration again. Diisopropyl ether was added to the concentrated solution for crystallization, and a solid obtained was dried under reduced pressure to obtain a target compound, or 4-tert-butylphenyl diphenylsulfonium 3-(adamantane-1-carbonyloxy)-2,2-difluoro-4-methylpentanoate (10 g) as a white crystal (yield: 82%).

Synthesis Example 1-4

Synthesis of ethyl 2,2-difluoro-3-hydroxy-3-phenylpropionate (Intermediate 2)

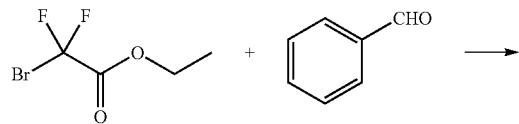

-continued

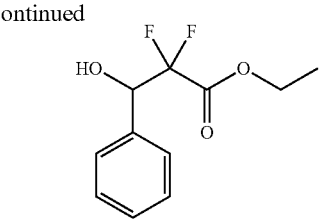

A mixed solution of ethyl bromodifluoroacetate (48 g), dibromoethane (4.5 g) and tetrahydrofuran (50 g) was dropped into a mixed solution of zinc (15 g), benzaldehyde (21 g), 60 mL of trimethyl borate and tetrahydrofuran (50 g) under heating condition of 60° C. and stirred at 90° C. for 10 hours. Thereafter, 10% by mass of hydrochloric acid (100 g) was added to the product to quench the reaction, an insoluble was removed by filtration, and a filtrate was washed with a saturated saline. The reaction solution after washing was concentrated under reduced pressure, and purified by distillation to obtain a target compound, or ethyl 2,2-difluoro-3-hydroxy-3-phenyl propionate (28 g) as a colorless oily matter (yield: 60%).

Synthesis Example 1-5

Synthesis of 1-adamantane carboxylic acid 2-ethoxycarbonyl-2,2-difluoro-1-phenylethyl ester (Intermediate 3)

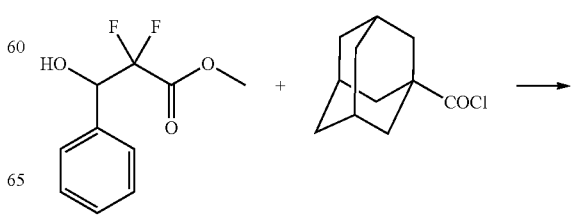

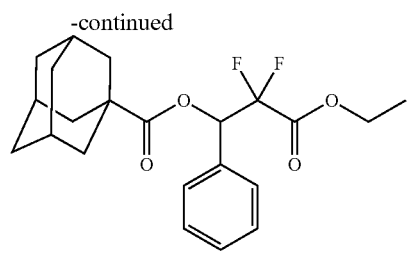

Ethyl 2,2-difluoro-3-hydroxy-3-phenylpropionate acid (9 g) prepared in Synthesis Example 1-4 and 1-adamantanecarbonyl chloride (9.5 g) were dissolved in methylene chloride (60 g), and a mixed solution of triethyl amine (6 g), 4-dimethyl aminopyridine (0.5 g) and methylene chloride (20 g) was dropped into the obtained solution under ice cooling. After aging overnight, 5% by mass hydrochloric acid was added to the product and quenched, and then the reaction solution was washed with water, and concentrated. Methylisobutyl ketone was added to the concentrated solution, and was concentrated again to obtain a target compound, or 1-adamantane carboxylic acid 2-ethoxycarbonyl-2,2-difluoro-1-phenyl-ethyl ester (15 g) as a colorless oily matter (yield: 68%).

Synthesis Example 1-6

Synthesis of triphenylsulfonium 3-(adamantane-1-carbonyloxy)-2,2-difluoro-3-phenyl propionate (Salt-3)

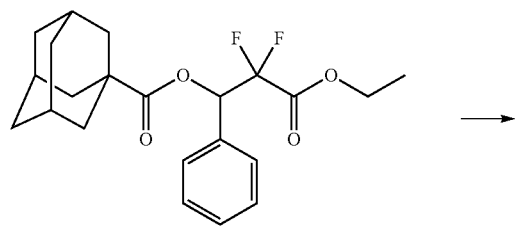

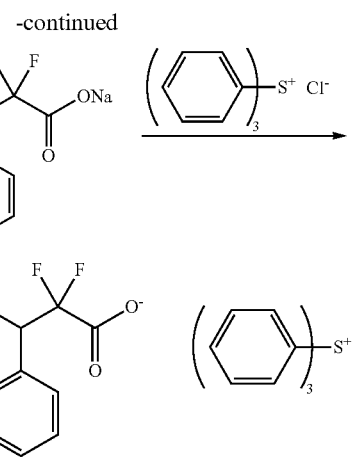

After stirring a mixed solution of 1-adamantane carboxylic acid 2-ethoxycarbonyl-2,2-difluoro-1-phenyl-ethyl ester (6.6 g) prepared in Synthesis Example 1-5, 1,4-dioxane (20 g) and 25% by mass of caustic soda (2.5 g) for 2 hours, water (30 g) was added to the reaction solution and washed with n-hexane to prepare an aqueous solution of sodium 3-(adamantane-1-carbonyloxy)-2,2-difluoro-3-phenyl propionate. An aqueous solution of triphenylsulfonium chloride (32 g) and methylene chloride (100 g) were added to the product, stirred for 30 minutes, and then an organic layer was isolated and washed with water, and thereafter was concentrated under reduced pressure. Methylisobutyl ketone was added to the concentrated solution, and concentrated again. Diisopropyl ether was added to the concentrated solution for crystallization, and a solid obtained was dried under reduced pressure to obtain a target compound, or triphenylsulfonium 3-(adamantane-1-carbonyloxy)-2,2-difluoro-3-phenyl propionate (5.5 g) as a white crystal (yield: 58%).

Synthesis Example 1-7

Synthesis of 4-tert-butylphenyl diphenyl sulfonium 3-(adamantane-1-carbonyloxy)-2,2-difluoro-3-phenyl propionate (Salt-4)

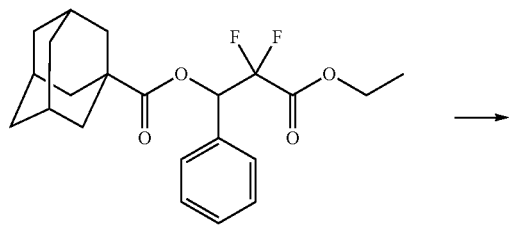

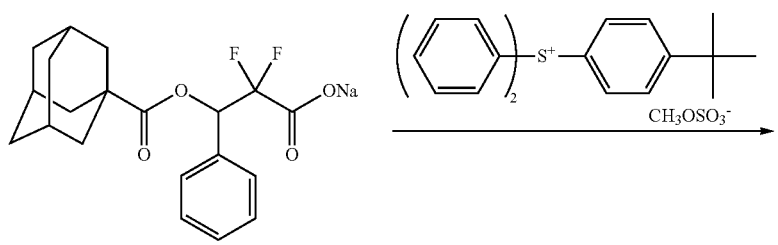

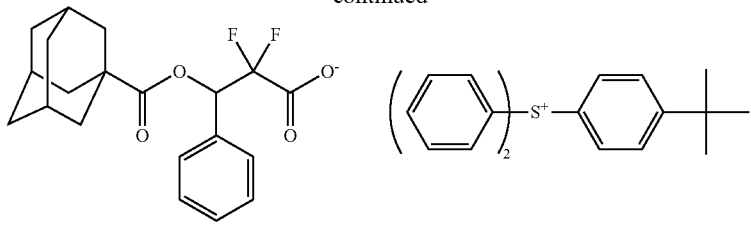

After stirring a mixed solution of 1-adamantane carboxylic acid 2-ethoxycarbonyl-2,2-difluoro-1-phenyl-ethyl ester (6.6 g) prepared in Synthesis Example 1-5, 1-4-dioxane (20 g) and 25% by mass of caustic soda (2.5 g) for 2 hours, water (30 g) was added to the reaction solution and washed with n-hexane to prepare an aqueous solution of sodium 3-(adamantane-1-carbonyloxy)-2,2-difluoro-3-phenyl propionate. An aqueous solution of 4-tert-butyl phenyldiphenylsulfonium methyl sulfate (95 g) and methylene chloride (100 g) were added to the product, stirred for 30 minutes, and then an organic layer was isolated and washed with water, and thereafter was concentrated under reduced pressure. Methylisobutyl ketone was added to the concentrated solution, and concentrated again. Diisopropyl ether was added to the concentrated solution for crystallization, and a solid obtained was dried under reduced pressure to obtain a target compound, or 4-tert-butylphenyldiphenyl sulfonium 3-(adamantane-1-carbonyloxy)-2,2-difluoro-3-phenyl propionate (5.4 g) as a white crystal (yield: 52%).

Synthesis Example 1-8

Synthesis of ethyl difluoro-(2-hydroxyadamantane-2-yl) acetate (Intermediate 4)

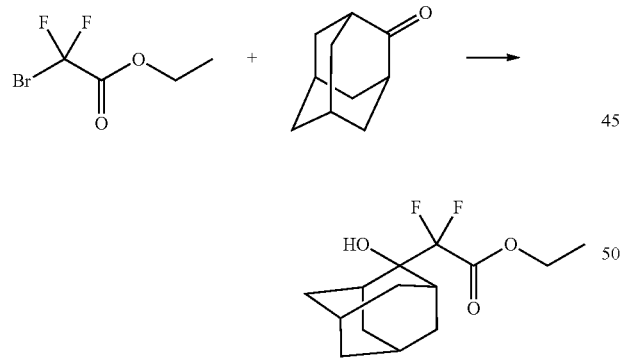

A mixed solution of ethyl bromodifluoro acetate (24 g), dibromoethane (2.2 g) and tetrahydrofuran (25 g) was dropped into a mixed solution of zinc (7.8 g), 2-adamantanone (15 g), 30 mL of trimethyl borate and tetrahydrofuran (25 g) under heating condition of 50° C. and then stirred at 80° C. for 10 hours. Thereafter, 5% by mass hydrochloric acid (50 g) was added to the product to quench the reaction, ethyl acetate (200 g) was added thereto to extract an organic layer, and the organic layer was washed with saturated saline, subsequently with water. The reaction solution washed was concentrated under reduced pressure, methylisobutyl ketone was added to the concentrated solution, and was concentrated under reduced pressure again, n-hexane was added to the concentrated solution for crystallization, and a solid obtained was dried under reduced pressure to obtain a target compound, or ethyl difluoro-(2-hydroxyadamantane-2-yl) acetate (15 g) as a white crystal (yield: 58%).

Synthesis Example 1-9

Synthesis of triphenylsulfonium difluoro-(2-hydroxyadamantane-2-yl) acetate (Salt-5)

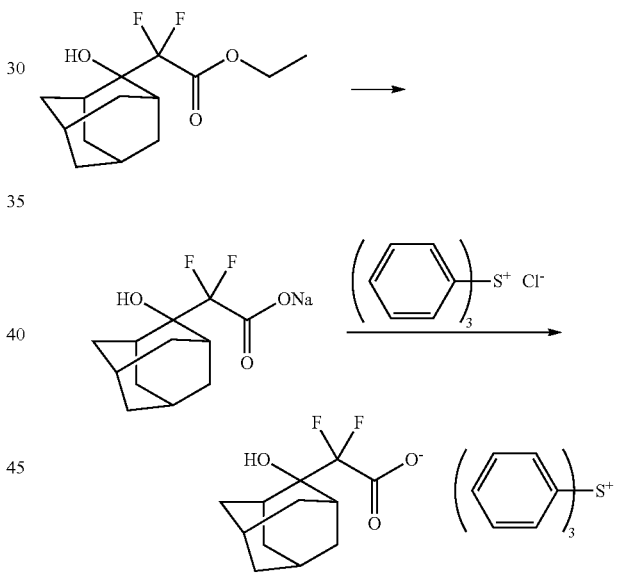

After stirring a mixed solution of ethyl difluoro-(2-hydroxyadamantane-2-yl) acetate (3.9 g) prepared in Synthesis Example 1-8, 1,4-dioxane (20 g) and 25% by mass of caustic soda (4.8 g) for 2 hours, 35% by mass hydrochloric acid (1.5 g) was added to the reaction solution, and then an aqueous solution of triphenyl sulfonium chloride (24 g) and methylene chloride (100 g) were added to the product. After stirring the product for 30 minutes, an organic layer was isolated and washed with water, and thereafter was concentrated under reduced pressure. Methylisobutyl ketone was added to the concentrated solution, and concentrated again. Diisopropyl ether was added to the concentrated solution for crystallization, and a solid obtained was dried under reduced pressure to obtain a target compound, or triphenyl sulfonium difluoro-(2-hydroxyadamantane-2-yl) acetate (4.7 g) as a white crystal (yield: 63%).

Synthesis Example 1-10

Synthesis of 4-fluorophenyl diphenylsulfonium difluoro-(2-hydroxyadamantane-2-yl) acetate (Salt-6)

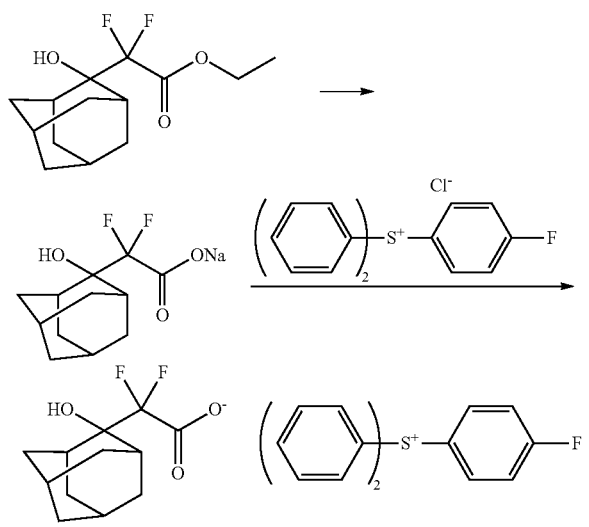

After stirring a mixed solution of ethyl difluoro-(2-hydroxyadamantane-2-yl) acetate (2.6 g) prepared in Synthesis Example 1-8, 1,4-dioxane (30 g), 25% by mass of caustic soda (4.0 g) and water (10 g) for 2 hours, 35% by mass hydrochloric acid (1.0 g) was added to the reaction solution, and an aqueous solution of 4-fluoro phenyldiphenylsulfonium chloride (66 g) and methylene chloride (100 g) were added to the product. After stirring the product for 30 minutes, an organic layer was isolated and washed with water, and thereafter was concentrated under reduced pressure. Methylisobutyl ketone was added to the concentrated solution, and concentrated again. Diisopropyl ether was added to the concentrated solution for removal of a supernatant to obtain a target compound, or 4-fluorophenyldiphenyl sulfonium difluoro-(2-hydroxyadamantane-2-yl) acetate (2.4 g) as a glassy solid (yield: 45%).

Synthesis Example 2

Synthesis of Polymer

Polymers used in the resist composition of the present invention was synthesized according to the following prescription. The composition ratio of each polymer synthesized is shown in Table 1, and the structures of repeating units are shown in Tables 2 to 4.

Polymer Synthesis Example 2-1

Synthesis of Polymer 1

Acetoxystyrene (238.0 g), 4-chlorostyrene (22.6 g), indene (189.4 g), and toluene (675 g) as a solvent were added to a 3 L flask. The reaction vessel was cooled down to a temperature of −70° C. in nitrogen atmosphere, vacuumed under reduced pressure, and nitrogen flow was repeated three times. After the reaction vessel was heated up to room temperature, 2,2'-azobis(2,4-dimethylvaleronitrile) (V-65, Product from Wako Pure Chemical Industries, Ltd.) (40.5 g) was added thereto as a polymerization initiator, the reaction vessel was heated up to 45° C. and reacted for 20 hours. Subsequently, the vessel was heated up to 55° C. and further reacted for 20 hours. The reaction solution was concentrated to ½, precipitated in 15.0 L of methanol solution, and a white solid obtained was filtered and dried under reduced pressure at 40° C. to obtain a white polymer (311 g).

The polymer was dissolved in methanol (488 g) and tetrahydrofuran (540 g) again, and then triethylamine (162 g) and water (32 g) were added thereto, and was subjected to a deprotection reaction at 60° C. for 40 hours. After concentrating the reaction solution, as a fractionating step, the product was dissolved in a mixed solvent of methanol (548 g) and acetone (112 g), and hexane (990 g) was dropped into the solution for 10 minutes. The mixed white solution was subjected to static separation, and a lower layer (polymer layer) was extracted and concentrated. Further, the concentrated polymer was dissolved in a mixed solvent of methanol (548 g) and acetone (112 g) again, the solution was subjected to dispersion and liquid separation operation using hexane (990 g), and the obtained lower layer (polymer layer) was concentrated. The concentrated solution was dissolved in ethyl acetate (870 g), and subjected to neutralization, separation and washing with a mixed liquid of water (250 g) and acetic acid (98 g) once, further with water (225 g) and pyridine (75 g) once, and liquid separation and washing with water (225 g) four times. Afterwards, an ethyl acetate solution of an upper layer was concentrated and dissolved in acetone (250 g), precipitated in 15 L of water and filtered, and vacuum-dried at 50° C. for 40 hours to obtain a white polymer (187 g).

The obtained polymer was subjected to $^{13}$C, $^{1}$H-NMR analyses and GPC measurement, and the following results were obtained.

Copolymer Composition Ratio (Molar Ratio)
Hydroxystyrene:4-chlorostyrene:indene=78.0:11.0:11.0
Weight average molecular weight (Mw)=4500
Molecular weight distribution (Mw/Mn)=1.65
This is defined as polymer 1.

Polymer Synthesis Example 2-2

Synthesis of Polymer 2

A solution, obtained by adding 4-acetoxystyrene (380.0 g), 4-chlorostyrene (70.0 g), acenaphthylene (50.1 g), dimethyl-2,2'-azobis-(2-methylpropionate) (V601, Product from Wako Pure Chemical Industries, Ltd.) (59 g), and toluene (900 g) as a solvent to a 3 L dropping cylinder in nitrogen atmosphere, was prepared. Further, toluene (300.0 g) was added to another 3 L polymerization flask in nitrogen atmosphere, heated at 80° C., and the solution prepared above was dropped for 4 hours. After completion of dropping, the polymerization temperature was maintained at 80° C. and the product was stirred for 18 hours, and cooled down to room temperature. The obtained polymerization solution was dropped into hexane (10 kg) and a extracted copolymer was filtered. The filtered copolymer was washed twice with a mixed liquid (2000 g) of hexane:toluene=10:1. The obtained copolymer was then dissolved in a mixed solvent of tetrahydrofuran (1260 g) and methanol (420 g) in a 3 L flask in nitrogen atmosphere, ethanolamine (180 g) was added thereto and the product was stirred at 60° C. for 3 hours. The reaction solution was concentrated under reduced pressure, and the concentrated product was dissolved in a mixed solvent of ethyl acetate (3000 g) and water (800 g), a solution obtained was fed to a separating funnel, and acetic acid (90 g) was added thereto to perform liquid separation. A lower layer of the solution was distilled off, and water (800 g) and pyridine (121 g) were added to the obtained organic layer to perform liquid separation again. Further, the lower layer was distilled off, and water (800 g) was added to the obtained organic layer to perform water-washing liquid separation five times. During placing the solution in each liquid separation process, acetone (150 g) was added to the solution, and slightly stirred to achieve favorable liquid separation.

After concentrating the liquid-separated organic layer, it was dissolved in acetone (1200 g), and the acetone solution through a 0.02 μm nylon filter was dropped into 10 L of water, a crystallized deposit obtained was filtered and washed with water. After the product was subjected to suction-filtration for 2 hours, the filtered product was dissolved in acetone (1200 g) again, a crystallized deposit, obtained by dropping the acetone solution through a 0.02 μm nylon filter into water (10 kg), was filtered, washed with water and dried to obtain a white polymer (400 g). The obtained polymer was subjected to $^{13}$C-NMR analysis and GPC measurement, and the following results were obtained.

Copolymer Composition Ratio (Molar Ratio)

Hydroxystyrene:4-chlorostyrene:acenaphthylene=75.0:15.0:10.0

Weight average molecular weight (Mw)=4100

Molecular weight distribution (Mw/Mn)=1.72

This is defined as polymer 2.

Polymer Synthesis Examples 2-3 to 15

Synthesis of Polymers 3 to 15

Resins shown in Table 1 were produced according to the method of Polymer Synthesis Examples 2-1 and 2-2, under the condition of different types and blending ratios of each monomer.

Structures of each unit in Table 1 are shown in Tables 2 to 4. In the following Table 1, the introduction ratio is denoted by molar ratio.

TABLE 1

| | Unit 1 | Introduction ratio (mol %) | Unit 2 | Introduction ratio (mol %) | Unit 3 | Introduction ratio (mol %) |
|---|---|---|---|---|---|---|
| Polymer 1 | A-1 | 78.0 | B-1 | 11.0 | C-1 | 11.0 |
| Polymer 2 | A-1 | 75.0 | B-1 | 15.0 | C-2 | 10.0 |
| Polymer 3 | A-1 | 74.0 | B-2 | 15.0 | C-1 | 11.0 |
| Polymer 4 | A-1 | 76.0 | B-2 | 14.0 | C-2 | 10.0 |
| Polymer 5 | A-1 | 75.0 | B-3 | 15.0 | C-1 | 10.0 |
| Polymer 6 | A-1 | 77.0 | B-3 | 12.0 | C-2 | 11.0 |
| Polymer 7 | A-1 | 74.0 | B-4 | 14.0 | C-1 | 12.0 |
| Polymer 8 | A-1 | 77.0 | B-4 | 13.0 | C-2 | 10.0 |
| Polymer 9 | A-1 | 57.0 | B-5 | 33.0 | C-1 | 10.0 |
| Polymer 10 | A-1 | 60.0 | B-5 | 30.0 | C-2 | 10.0 |
| Polymer 11 | A-2 | 68.0 | B-1 | 22.0 | C-1 | 10.0 |
| Polymer 12 | A-2 | 67.0 | B-2 | 23.0 | C-2 | 10.0 |
| Polymer 13 | A-2 | 50.0 | B-1 | 15.0 | C-3 | 35.0 |
| Polymer 14 | A-2 | 48.0 | B-2 | 17.0 | C-3 | 35.0 |
| Polymer 15 | A-2 | 49.0 | B-5 | 16.0 | C-3 | 35.0 |

TABLE 2

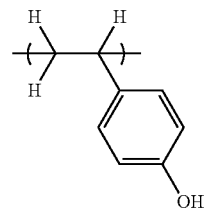

A-1

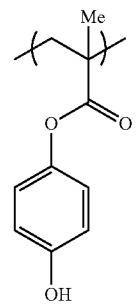

A-2

TABLE 3

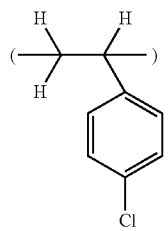

B-1

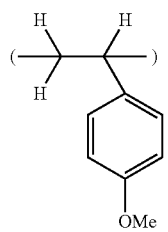

B-2

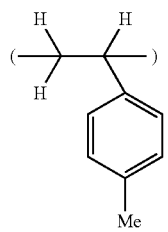

B-3

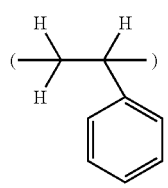

B-4

TABLE 3-continued

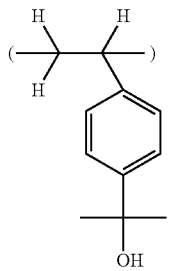
B-5

TABLE 4

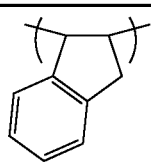
C-1

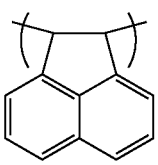
C-2

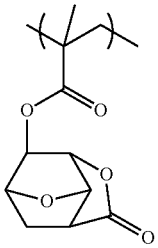
C-3

<Preparation of Negative Resist Composition (1)>
(A) Salt according to the present invention synthesized in the above Synthesis Example, comparative salt and the following Base-1 and Base-2 as an acid diffusion control agent,
(B) Polymers synthesized above (polymers 1 to 15), and
(C) Salt having structures represented by the following PAG-1 and PAG-2 as a photo acid generator, the above components were dissolved in an organic solvent with compositions shown in the following Tables 6a and 6b to prepare a resist composition. By filtering each composition through a 0.2 μm filter or a 0.02 μm nylon or UPE filter, each solution of negative resist compositions was prepared. The acid diffusion control agent includes salts according to the present invention shown (Salt-1 to Salt-6) and comparative salts (comparative Salt-1 and Salt-2) in the following Table 5, and the ones represented by the following Base-1 and Base-2. Tetramethoxymethyl glycol urea (TMGU) was added to some compositions as a crosslinking agent, and a composition in which a crosslinking agent is not contained was also prepared. 0.075 parts by mass of PF-636 (Product from OMNOVA SOLUTIONS) was added as a surfactant. Organic solvents in Tables 6a and 6b are PGMEA (propylene glycol monomethylether acetate), EL (ethyl lactate), PGME (propylene glycol monomethylether), and CyH (cyclohexanone).

(PAG-1)

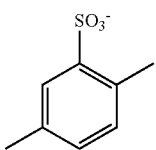 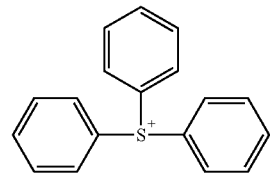

(PAG-2)

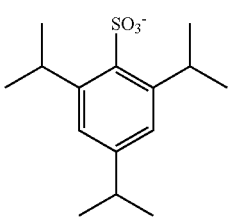 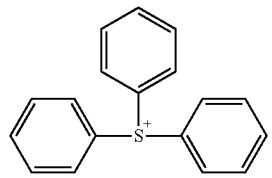

Base-1

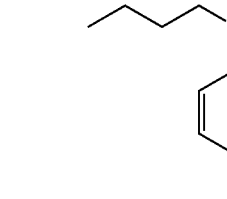

(Base-2)

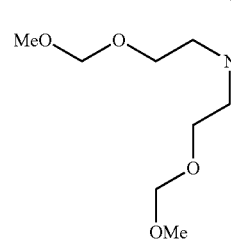

TABLE 5

Salt-1

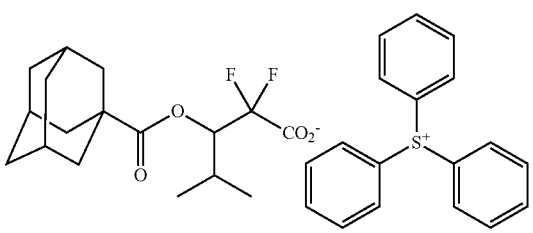

TABLE 5-continued
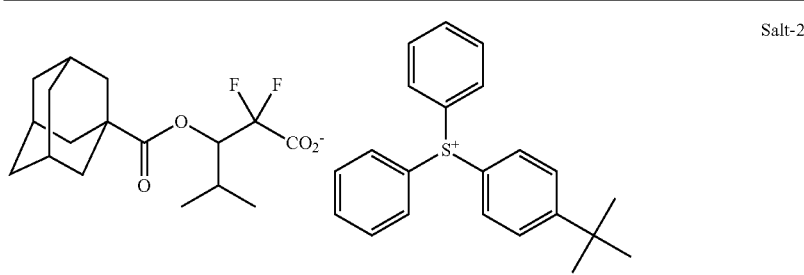
Salt-2
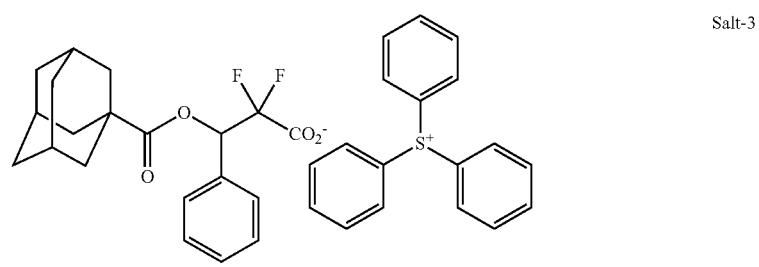
Salt-3
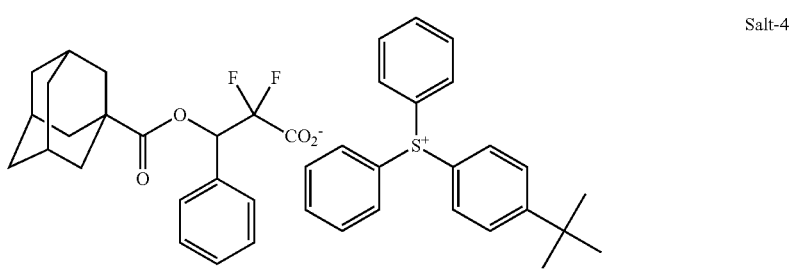
Salt-4
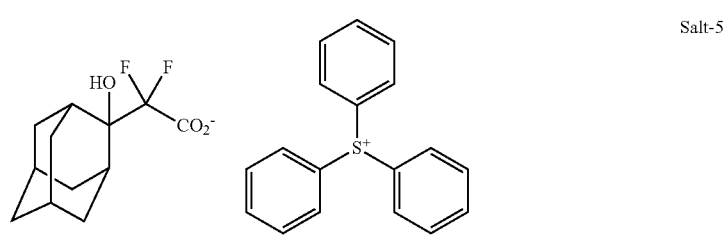
Salt-5
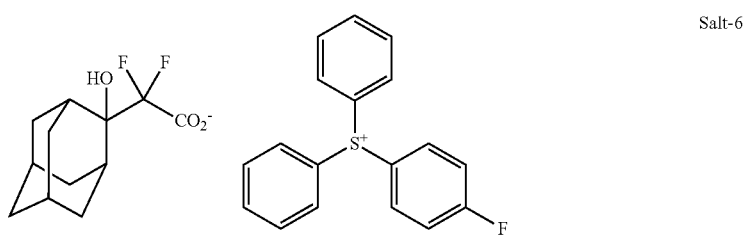
Salt-6
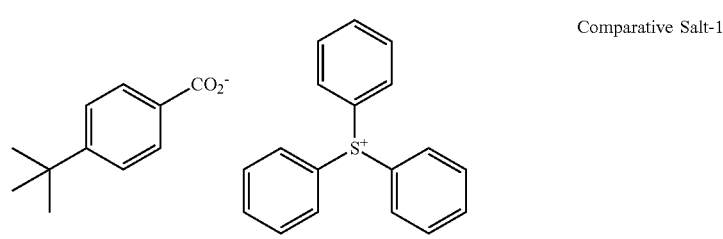
Comparative Salt-1

TABLE 5-continued

| Structure | |
|---|---|
| (1-adamantanecarbonyloxy-isopropyl-CH2-CO2−) triphenylsulfonium | Comparative Salt-2 |

TABLE 6a

| | Acid diffusion control agent | Resin | Photo acid generator | Crosslinking agent | Solvent 1 | Solvent 2 | Solvent 3 |
|---|---|---|---|---|---|---|---|
| Example 1 | Salt-1 (3.6) | Polymer 1 (80) | PAG-1 (8) PAG-2 (2) | TMGU (8.2) | PGMEA (940) | EL (2170) | — |
| Example 2 | Salt-1 (3.0) Base-1 (0.3) | Polymer 1 (80) | PAG-1 (8) PAG-2 (2) | TMGU (8.2) | PGMEA (940) | EL (2170) | — |
| Example 3 | Salt-1 (3.0) Base-2 (0.3) | Polymer 1 (80) | PAG-1 (8) PAG-2 (2) | TMGU (8.2) | PGMEA (940) | EL (2170) | — |
| Example 4 | Salt-1 (3.0) Base-1 (0.15) Base-2 (0.15) | Polymer 1 (80) | PAG-1 (8) PAG-2 (2) | TMGU (8.2) | PGMEA (940) | EL (2170) | — |
| Example 5 | Salt-1 (3.6) | Polymer 2 (80) | PAG-1 (8) PAG-2 (2) | TMGU (8.2) | PGMEA (940) | EL (2170) | — |
| Example 6 | Salt-1 (3.0) Base-1 (0.3) | Polymer 2 (80) | PAG-1 (8) PAG-2 (2) | TMGU (8.2) | PGMEA (940) | EL (2170) | — |
| Example 7 | Salt-1 (3.0) Base-2 (0.3) | Polymer 2 (80) | PAG-1 (8) PAG-2 (2) | TMGU (8.2) | PGMEA (940) | EL (2170) | — |
| Example 8 | Salt-1 (3.0) Base-1 (0.15) Base-2 (0.15) | Polymer 2 (80) | PAG-1 (8) PAG-2 (2) | TMGU (8.2) | PGMEA (940) | EL (2170) | — |
| Example 9 | Salt-1 (3.6) | Polymer 3 (80) | PAG-1 (8) PAG-2 (2) | TMGU (8.2) | PGMEA (940) | EL (2170) | — |
| Example 10 | Salt-1 (3.6) | Polymer 4 (80) | PAG-1 (8) PAG-2 (2) | TMGU (8.2) | PGMEA (940) | EL (2170) | — |
| Example 11 | Salt-1 (3.6) | Polymer 5 (80) | PAG-1 (8) PAG-2 (2) | TMGU (8.2) | PGMEA (940) | EL (2170) | — |
| Example 12 | Salt-1 (3.6) | Polymer 6 (80) | PAG-1 (8) PAG-2 (2) | TMGU (8.2) | PGMEA (940) | EL (2170) | — |
| Example 13 | Salt-1 (3.6) | Polymer 7 (80) | PAG-1 (8) PAG-2 (2) | TMGU (8.2) | PGMEA (940) | EL (2170) | — |
| Example 14 | Salt-1 (3.6) | Polymer 8 (80) | PAG-1 (8) PAG-2 (2) | TMGU (8.2) | PGMEA (940) | EL (2170) | — |
| Example 15 | Salt-1 (3.6) | Polymer 9 (80) | PAG-1 (8) PAG-2 (2) | — | PGMEA (940) | EL (2170) | — |
| Example 16 | Salt-1 (3.0) Base-1 (0.3) | Polymer 9 (80) | PAG-1 (8) PAG-2 (2) | — | PGMEA (940) | EL (2170) | — |
| Example 17 | Salt-1 (3.6) | Polymer 10 (80) | PAG-1 (8) PAG-2 (2) | — | PGMEA (940) | EL (2170) | — |
| Example 18 | Salt-1 (3.0) Base-1 (0.3) | Polymer 10 (80) | PAG-1 (8) PAG-2 (2) | — | PGMEA (940) | EL (2170) | — |
| Example 19 | Salt-1 (3.6) | Polymer 11 (80) | PAG-1 (8) PAG-2 (2) | TMGU (8.2) | PGMEA (940) | EL (2170) | — |
| Example 20 | Salt-1 (3.6) | Polymer 12 (80) | PAG-1 (8) PAG-2 (2) | TMGU (8.2) | PGMEA (940) | EL (2170) | — |
| Example 21 | Salt-2 (3.6) | Polymer 1 (80) | PAG-1 (8) PAG-2 (2) | TMGU (8.2) | PGMEA (940) | EL (2170) | — |
| Example 22 | Salt-2 (3.0) Base-1 (0.3) | Polymer 1 (80) | PAG-1 (8) PAG-2 (2) | TMGU (8.2) | PGMEA (940) | EL (2170) | — |
| Example 23 | Salt-2 (3.6) | Polymer 10 (80) | PAG-1 (8) PAG-2 (2) | — | PGMEA (940) | EL (2170) | — |
| Example 24 | Salt-2 (3.0) Base-1 (0.3) | Polymer 10 (80) | PAG-1 (8) PAG-2 (2) | — | PGMEA (940) | EL (2170) | — |
| Example 25 | Salt-3 (3.6) | Polymer 1 (80) | PAG-1 (8) PAG-2 (2) | TMGU (8.2) | PGMEA (940) | EL (2170) | — |

TABLE 6b

| Example | | | | | | | |
|---|---|---|---|---|---|---|---|
| Example 26 | Salt-3 (3.0) Base-1 (0.3) | Polymer 1 (80) | PAG-1 (8) PAG-2 (2) | TMGU (8.2) | PGMEA (940) | EL (2170) | — |
| Example 27 | Salt-3 (3.6) | Polymer 10 (80) | PAG-1 (8) PAG-2 (2) | — | PGMEA (940) | EL (2170) | — |
| Example 28 | Salt-3 (3.0) Base-1 (0.3) | Polymer 10 (80) | PAG-1 (8) PAG-2 (2) | — | PGMEA (940) | EL (2170) | — |
| Example 29 | Salt-4 (3.6) | Polymer 1 (80) | PAG-1 (8) PAG-2 (2) | TMGU (8.2) | PGMEA (940) | EL (2170) | — |
| Example 30 | Salt-4 (3.0) Base-1 (0.3) | Polymer 1 (80) | PAG-1 (8) PAG-2 (2) | TMGU (8.2) | PGMEA (940) | EL (2170) | — |
| Example 31 | Salt-4 (3.6) | Polymer 10 (80) | PAG-1 (8) PAG-2 (2) | — | PGMEA (940) | EL (2170) | — |
| Example 32 | Salt-4 (3.0) Base-1 (0.3) | Polymer 10 (80) | PAG-1 (8) PAG-2 (2) | — | PGMEA (940) | EL (2170) | — |
| Example 33 | Salt-5 (3.6) | Polymer 1 (80) | PAG-1 (8) PAG-2 (2) | TMGU (8.2) | PGMEA (940) | EL (2170) | — |
| Example 34 | Salt-5 (3.0) Base-1 (0.3) | Polymer 1 (80) | PAG-1 (8) PAG-2 (2) | TMGU (8.2) | PGMEA (940) | EL (2170) | — |
| Example 35 | Salt-5 (3.6) | Polymer 10 (80) | PAG-1 (8) PAG-2 (2) | — | PGMEA (940) | EL (2170) | — |
| Example 36 | Salt-5 (3.0) Base-1 (0.3) | Polymer 10 (80) | PAG-1 (8) PAG-2 (2) | — | PGMEA (940) | EL (2170) | — |
| Example 37 | Salt-6 (3.6) | Polymer 1 (80) | PAG-1 (8) PAG-2 (2) | TMGU (8.2) | PGMEA (940) | EL (2170) | — |
| Example 38 | Salt-6 (3.0) Base-1 (0.3) | Polymer 1 (80) | PAG-1 (8) PAG-2 (2) | TMGU (8.2) | PGMEA (940) | EL (2170) | — |
| Example 39 | Salt-6 (3.6) | Polymer 10 (80) | PAG-1 (8) PAG-2 (2) | — | PGMEA (940) | EL (2170) | — |
| Example 40 | Salt-6 (3.0) Base-1 (0.3) | Polymer 10 (80) | PAG-1 (8) PAG-2 (2) | — | PGMEA (940) | EL (2170) | — |
| Example 41 | Salt-1 (3.6) | Polymer 13 (80) | PAG-1 (8) | TMGU (8.2) | PGMEA (800) | CyH (1,600) | PGME (400) |
| Example 42 | Salt-1 (3.6) | Polymer 14 (80) | PAG-1 (8) | TMGU (8.2) | PGMEA (800) | CyH (1,600) | PGME (400) |
| Example 43 | Salt-1 (3.6) | Polymer 15 (80) | PAG-1 (8) | — | PGMEA (800) | CyH (1,600) | PGME (400) |
| Comparative Example 1 | Comparative Salt-1 (1.7) | Polymer 1 (80) | PAG-1 (8) PAG-2 (2) | TMGU (8.2) | PGMEA (940) | EL (2170) | — |
| Comparative Example 2 | Comparative Salt-1 (1.4) Base-1 (0.3) | Polymer 1 (80) | PAG-1 (8) PAG-2 (2) | TMGU (8.2) | PGMEA (940) | EL (2170) | — |
| Comparative Example 3 | Comparative Salt-2 (2.4) | Polymer 1 (80) | PAG-1 (8) PAG-2 (2) | TMGU (8.2) | PGMEA (940) | EL (2170) | — |
| Comparative Example 4 | Comparative Salt-2 (2.4) | Polymer 9 (80) | PAG-1 (8) PAG-2 (2) | TMGU (8.2) | PGMEA (940) | EL (2170) | — |
| Comparative Example 5 | Comparative Salt-1 (1.7) | Polymer 1 (80) | PAG-1 (8) | TMGU (8.2) | PGMEA (800) | CyH (1,600) | PGME (400) |
| Comparative Example 6 | Comparative Salt-2 (2.4) | Polymer 1 (80) | PAG-1 (8) | TMGU (8.2) | PGMEA (800) | CyH (1,600) | PGME (400) |

Resist compositions of the present invention shown in the above Tables 6a and 6b (Examples 1 to 43) contain salts represented by the above general formula (1) (Salt-1 to Salt-6), and arenesulfonate (PAG-1 and PAG-2) that generate an acid stronger than an acid generated from the salt represented by the above general formula (1). The salts represented by the above general formula (1) in the compositions function as an acid diffusion control agent.

Electron Beam Lithography Evaluation (1)

Examples 1 to 40, Comparative Examples 1 to 4

The negative resist compositions prepared above (Examples 1 to 40, Comparative Examples 1 to 4) were spin-coated on a mask blank whose 152 mm square top surface is a chrome oxynitride film using an ACT-M (Product from Tokyo Electron Limited.), and pre-baked on a heated plate at 90° C. for 600 seconds to produce a resist film 90 nm thick. The film thickness of a resist film obtained was measured using optical film thickness measurement system Nanospec (Product from Nanometrics Incorporated.). The film thickness was measured at 81 in-plate positions of a blank substrate excluding an outer edge portion within 10 mm inward from a blank outer circumference to calculate the average film thickness value and the ranges of the film thickness.

Moreover, each product was exposed using an electron beam exposure apparatus (Product from NuFlare Technology Inc.: EBM-5000plus, accelerating voltage; 50 keV), and baked (PEB: post exposure bake) at 120° C. for 600 seconds, and developed with a 2.38% by mass of tetramethylammonium hydroxide aqueous solution to obtain a negative pattern. A resist pattern obtained was evaluated as follows.

A patterned mask blank produced was observed with top-down scanning electron microscope (SEM), the exposure does for resolving 400 nm 1:1 line and space (LS) by 1:1 was defined as an optimal exposure does ($\mu C/cm^2$), and the minimum dimension at the exposure does for resolving 400 nm 1:1 line and space (LS) by 1:1 was defined as limiting resolution, and line edge roughness (LER) with 200 nm LS was measured with SEM. It was visually determined whether the pattern profile is rectangular or not. To evaluate CD uniformity (CDU), the line width, subjected to the exposure does ($\mu C/cm^2$) for resolving a 400 nm 1:1 line and space by 1:1, was measured at 49 in-plate positions of a blank substrate excluding an outer edge portion within 20 mm from a blank outer circumference to calculate 3σ value from a value obtained by deducting a measuring point from its average line width value. Each resist composition was evaluated and the results are shown in Table 7.

and puddle-developed for 30 seconds with 2.38% by mass of a TMAH aqueous solution to obtain a negative pattern.

The obtained resist pattern was evaluated as follows. The minimum dimension at the exposure does for resolving 35 nm line and space (LS) by 1:1 was defined as a limiting resolution, and line edge roughness (LER) of 35 nm LS

TABLE 7

|  | Optimum Exposure dose (μC/cm²) | Limiting resolution (LS) (nm) | Limiting resolution (IS) (nm) | LER (nm) | CDU (3σ) (nm) | Pattern profile |
| --- | --- | --- | --- | --- | --- | --- |
| Example 1 | 34 | 40 | 40 | 4.6 | 2.3 | Rectangular |
| Example 2 | 35 | 40 | 40 | 4.8 | 2.2 | Rectangular |
| Example 3 | 34 | 40 | 40 | 4.7 | 2.1 | Rectangular |
| Example 4 | 29 | 40 | 40 | 4.7 | 2.4 | Rectangular |
| Example 5 | 31 | 40 | 40 | 4.8 | 2.5 | Rectangular |
| Example 6 | 32 | 40 | 40 | 4.8 | 2.4 | Rectangular |
| Example 7 | 34 | 40 | 40 | 4.5 | 2.2 | Rectangular |
| Example 8 | 35 | 40 | 40 | 4.5 | 2.5 | Rectangular |
| Example 9 | 32 | 40 | 40 | 4.5 | 2.4 | Rectangular |
| Example 10 | 33 | 40 | 40 | 4.9 | 2.3 | Rectangular |
| Example 11 | 31 | 40 | 40 | 4.8 | 2.2 | Rectangular |
| Example 12 | 33 | 40 | 40 | 4.9 | 2.3 | Rectangular |
| Example 13 | 33 | 40 | 40 | 4.9 | 2.4 | Rectangular |
| Example 14 | 34 | 40 | 40 | 4.8 | 2.2 | Rectangular |
| Example 15 | 34 | 40 | 40 | 4.8 | 2.3 | Rectangular |
| Example 16 | 33 | 40 | 40 | 4.8 | 2.3 | Rectangular |
| Example 17 | 33 | 40 | 40 | 4.8 | 2.4 | Rectangular |
| Example 18 | 34 | 40 | 40 | 4.6 | 2.3 | Rectangular |
| Example 19 | 34 | 40 | 40 | 4.7 | 2.4 | Rectangular |
| Example 20 | 35 | 40 | 40 | 4.9 | 2.4 | Rectangular |
| Example 21 | 35 | 40 | 40 | 4.6 | 2.5 | Rectangular |
| Example 22 | 35 | 40 | 40 | 4.5 | 2.3 | Rectangular |
| Example 23 | 35 | 40 | 40 | 4.8 | 2.4 | Rectangular |
| Example 24 | 35 | 40 | 40 | 4.8 | 2.4 | Rectangular |
| Example 25 | 30 | 40 | 40 | 4.7 | 2.3 | Rectangular |
| Example 26 | 32 | 40 | 40 | 4.6 | 2.5 | Rectangular |
| Example 27 | 32 | 40 | 40 | 4.8 | 2.4 | Rectangular |
| Example 28 | 33 | 40 | 40 | 4.9 | 2.3 | Rectangular |
| Example 29 | 32 | 40 | 40 | 4.7 | 2.4 | Rectangular |
| Example 30 | 32 | 40 | 40 | 4.8 | 2.4 | Rectangular |
| Example 31 | 34 | 40 | 40 | 4.7 | 2.5 | Rectangular |
| Example 32 | 31 | 40 | 40 | 4.7 | 2.3 | Rectangular |
| Example 33 | 31 | 40 | 40 | 4.7 | 2.5 | Rectangular |
| Example 34 | 32 | 40 | 40 | 4.6 | 2.2 | Rectangular |
| Example 35 | 32 | 40 | 40 | 4.5 | 2.4 | Rectangular |
| Example 36 | 32 | 40 | 40 | 4.7 | 2.3 | Rectangular |
| Example 37 | 33 | 40 | 40 | 4.7 | 2.4 | Rectangular |
| Example 38 | 33 | 40 | 40 | 4.6 | 2.3 | Rectangular |
| Example 39 | 33 | 40 | 40 | 4.8 | 2.5 | Rectangular |
| Example 40 | 34 | 40 | 40 | 4.8 | 2.5 | Rectangular |
| Comparative Example 1 | 34 | 50 | 55 | 6.5 | 3.6 | Rectangular |
| Comparative Example 2 | 34 | 50 | 55 | 6.2 | 3.5 | Rectangular |
| Comparative Example 3 | 34 | 50 | 55 | 5.6 | 3.6 | Rectangular |
| Comparative Example 4 | 34 | 50 | 55 | 5.7 | 3.6 | Rectangular |

EUV Exposure Evaluation (1)

Examples 41 to 43, Comparative Example 5 and 6

The negative resist compositions prepared above (Examples 41 to 43, Comparative Example 5 and 6) were spin-coated on an Si substrate with diameter of 4 inches subjected to vapor prime treatment with hexamethyldisilazane (HMDS) and pre-baked on a heated plate at 105° C. for 60 seconds to form a resist film 50 nm thick. The product was subjected to EUV exposure with NA 0.3 dipole illumination.

The product was subjected to post exposure bake (PEB) on a heated plate for 60 seconds immediately after exposure, pattern was measured with SEM. It was visually determined whether the pattern profile is rectangular or not. Each resist composition was evaluated and the results are shown in Table 8.

TABLE 8

|  | Optimum Exposure dose (LS) (mJ/cm²) | Limiting Resolution (LS) (nm) | LER (nm) | Pattern profile |
| --- | --- | --- | --- | --- |
| Example 41 | 26 | 28 | 4.7 | Rectangular |
| Example 42 | 28 | 30 | 4.9 | Rectangular |
| Example 43 | 26 | 30 | 4.8 | Rectangular |

TABLE 8-continued

| | Optimum Exposure dose (LS) (mJ/cm²) | Limiting Resolution (LS) (nm) | LER (nm) | Pattern profile |
|---|---|---|---|---|
| Comparative Example 5 | 27 | 50 | 6.1 | Rectangular |
| Comparative Example 6 | 26 | 50 | 5.9 | Rectangular |

The results in the above Tables 7 and 8 will be described. In the above Tables 7 and 8, the salts represented by the above general formula (1) are used as an acid diffusion control agent. The resist compositions containing the salts represented by the above general formula (1) (Examples 1 to 40 and Examples 41 to 43) show a favorable resolution and pattern rectangularity, and a favorable LER value. Meanwhile, resist compositions using benzoic acid salt, or a salt having no fluorine atom at α position of a carboxyl group (Comparative Examples 1 to 4 and Comparative Examples 5 and 6), in place of a salt represented by the above general formula (1), showed an unfavorable resolution, LER and CDU, compared to Examples. Salts used in these Comparative Examples cause no exchange reaction, resulting in deterioration of roughness, due to too large difference in pKa with benzene sulfonic acid generated from a photo acid generator.

<Preparation of Negative Resist Composition (2)>
(A) Salts according to the present invention synthesized in the above Synthesis Examples (Salt-1 and Salt-5 in Table 5) and comparative salt (the above PAG-1) as a photo acid generator,
(B) Polymers synthesized above (polymers 1, 2 and 5),
(C) the above Base-1 as an acid diffusion control agent, the above components were dissolved in an organic solvent, using compositions shown in Table 9 to prepare resist compositions. Each composition was filtered through a 0.2 µm filter or a 0.02 µm nylon or UPE filter to prepare each solution of a negative resist composition. Tetramethoxymethyl glycol urea (TMGU) was added to some compositions as a crosslinking agent, and a composition containing no crosslinking agent was also prepared. Organic solvents in Table 9 include PGMEA (propylene glycol monomethylether acetate), EL (ethyl lactate), PGME (propylene glycol monomethylether), and CyH (cyclohexanone). 0.075 parts by mass of PF-636 (Product from OMNOVA SOLUTIONS) was added to each composition as a surfactant.

TABLE 9

| | Photo acid generator | Resin | Acid diffusion control agent | Crosslinking agent | Solvent 1 | Solvent 2 |
|---|---|---|---|---|---|---|
| Example 44 | Salt-1 (10) | Polymer 1 (80) | base-1 (0.5) | TMGU (8.2) | PGMEA (940) | EL (2170) |
| Example 45 | Salt-1 (10) | Polymer 2 (80) | base-1 (0.5) | TMGU (8.2) | PGMEA (940) | EL (2170) |
| Example 46 | Salt-1 (10) | Polymer 5 (80) | base-1 (0.5) | — | PGMEA (940) | EL (2170) |
| Example 47 | Salt-5 (10) | Polymer 1 (80) | — | TMGU (8.2) | PGMEA (940) | EL (2170) |
| Example 48 | Salt-5 (10) | Polymer 2 (80) | — | TMGU (8.2) | PGMEA (940) | EL (2170) |
| Example 49 | Salt-5 (10) | Polymer 5 (80) | — | — | PGMEA (940) | EL (2170) |
| Comparative Example 7 | PAG-1 (8) | Polymer 1 (80) | base-1 (1.0) | TMGU (8.2) | PGMEA (940) | EL (2170) |
| Comparative Example 8 | PAG-1 (8) | Polymer 5 (80) | base-1 (1.0) | — | PGMEA (940) | EL (2170) |

Electron Beam Lithography Evaluation (2)

Examples 44 to 49, Comparative Examples 7 and 8

The negative resist compositions prepared above (Examples 44 to 49, Comparative Examples 7 and 8) were spin-coated on a mask blank whose 152 mm square top surface is a chrome oxynitride film by using an ACT-M (Product from Tokyo Electron Limited.) and pre-baked on a heated plate at 90° C. for 600 seconds to produce a resist film 90 nm thick. The film thickness of the obtained resist film was measured with an optical film thickness measurement system Nanospec (Product from Nanometrics Incorporated.). The film thickness was measured at 81 in-plate positions of a blank substrate excluding an outer edge portion within 10 mm from a blank outer circumference to calculate the average film thickness value and the ranges of the film thickness.

Moreover, the resist film was exposed with an electron beam exposure apparatus (Product from NuFlare Technology Inc.: EBM-5000plus, accelerating voltage; 50 keV), baked (PEB: post exposure bake) at 90° C. for 600 seconds, and developed with 2.38% by mass of tetramethyl ammonium hydroxide aqueous solution to obtain a negative pattern. The obtained resist pattern was evaluated as follows.

A patterned mask blank produced was observed with top-down scanning electron microscope (SEM), the exposure does for resolving 400 nm 1:1 line and space (LS) by 1:1 was defined as an optimal exposure does (µC/cm²), and the minimum dimension at the exposure does for resolving 400 nm 1:1 line and space (LS) by 1:1 was defined as limiting resolution, and edge roughness of 200 nm LS pattern was measured with SEM. It was visually determined whether the pattern profile is rectangular or not. To evaluate CD uniformity (CDU), the line width, subjected to the exposure does (µC/cm²) for resolving a 400 nm 1:1 line and space by 1:1, was measured at 49 in-plate positions of a blank substrate excluding an outer edge portion within 20 mm from a blank outer circumference to calculate 3σ value from a value obtained by deducting a measuring point from its average line width value. Each resist composition was evaluated and the results are shown in Table 10.

TABLE 10

|  | Optimum Exposure (LS) (μC/cm²) | Limiting resolution (LS) (nm) | Limiting resolution (IS) (nm) | LER (nm) | CDU (3σ) (nm) | Pattern profile |
| --- | --- | --- | --- | --- | --- | --- |
| Example 44 | 57 | 40 | 40 | 4.6 | 2.3 | Rectangular |
| Example 45 | 55 | 40 | 40 | 4.7 | 2.3 | Rectangular |
| Example 46 | 56 | 40 | 40 | 4.7 | 2.3 | Rectangular |
| Example 47 | 42 | 40 | 40 | 4.8 | 2.2 | Rectangular |
| Example 48 | 44 | 40 | 40 | 4.8 | 2.4 | Rectangular |
| Example 49 | 43 | 40 | 40 | 4.9 | 2.5 | Rectangular |
| Comparative Example 7 | 34 | 50 | 55 | 6.5 | 3.6 | Rectangular |
| Comparative Example 8 | 34 | 50 | 55 | 6.2 | 3.5 | Rectangular |

The results in the above Table 10 will be described. Resist compositions containing a salt represented by the above general formula (1) as a photo acid generator (Examples 44 to 49) showed a favorable resolution and pattern rectangularity, and a favorable LER value. Meanwhile, resist compositions using benzenesulfonate as a photo acid generator in Comparative Examples 7 and 8 showed an unfavorable resolution, LER and CDU compared to Examples. This is probably attributed to the fact that a base resin unfavorably slightly crosslinks at a non-exposed area after an acid generated by exposure diffused to a non-exposed area. Since the salt according to the present invention generates an acid whose acidity is lower than that of a salt used in Comparative Example, resist compositions containing a salt according to the present invention can rarely cause the above problem, compared to a resist composition using a salt in Comparative Example. Consequently, a pattern with reduced roughness can be formed.

As obviously described above, use of the resist composition of the present invention can provide an extremely high resolution, and enables a pattern with a low line edge roughness can be formed by exposure. The resist patterning process using the same is useful in manufacturing a semiconductor device, particularly in photo lithography for processing a photo mask blank.

It must be stated here that the present invention is not restricted to the embodiments shown by the above-mentioned embodiments. The above-mentioned embodiments are merely examples so that any embodiments composed of substantially the same technical concept as disclosed in the claims of the present invention and expressing a similar effect are included in the technical scope of the present invention.

What is claimed is:

1. A chemically-amplified negative resist composition for high energy beam exposure comprising: (A) a salt represented by the following general formula (1); and (B) a resin containing one or more kinds of repeating units represented by the following general formulae (UN-1) and (UN-2),

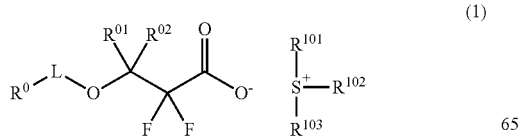

(1)

wherein $R^0$ represents a hydrogen atom, or a linear monovalent hydrocarbon group having 1 to 20 carbon atoms or a branched or a cyclic monovalent hydrocarbon group having 3 to 20 carbon atoms with which a hetero atom may be substituted or in which a hetero atom may be included; each $R^{01}$ and $R^{02}$ independently represents a hydrogen atom, or a linear monovalent hydrocarbon group having 1 to 20 carbon atoms or a branched or a cyclic monovalent hydrocarbon group having 3 to 20 carbon atoms, and $R^{01}$ and $R^{02}$ may mutually be bonded to form a cyclic structure together with a carbon atom bonded by the same and a carbon atom between the same, and at least one of $R^0$, $R^{01}$ and $R^{02}$ has a cyclic structure; each $R^{101}$, $R^{102}$ and $R^{103}$ independently represents a linear monovalent hydrocarbon group having 1 to 20 carbon atoms or a branched or a cyclic monovalent hydrocarbon group having 3 to 20 carbon atoms with which a hetero atom may be substituted or in which a hetero atom may be included, and two or more of $R^{101}$, $R^{102}$ and $R^{103}$ may mutually be bonded to form a cyclic structure together with a sulfur atom in the formula; and L represents a single bond or any of an ester bond, a sulfonic acid ester bond, a carbonate bond and a carbamate bond each of which is formed together with an adjacent oxygen atom,

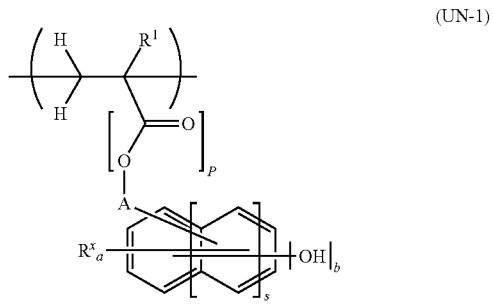

(UN-1)

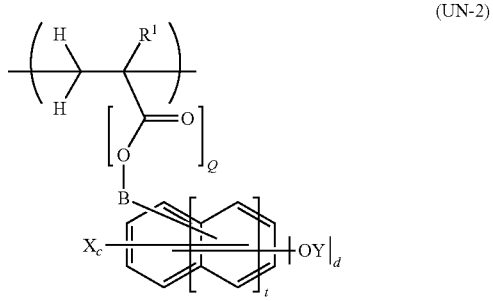

(UN-2)

wherein each A and B represents a single bond or an alkylene group having 1 to 10 carbon atoms that may contain an ether bond in a chain of the alkylene group; each $R^1$ independently represents a hydrogen atom or a methyl group; $R^X$ represents a hydrogen atom or an alkyl group having 1 to 6 carbon atoms; X represents a hydrogen atom, a linear, a branched or a cyclic alkyl group, substituted or unsubstituted, having 1 to 20 carbon atoms, an alkoxyalkyl group having 2 to 20 carbon atoms, an alkylthioalkyl group having 2 to 20 carbon atoms, a halogen atom, a nitro group, a cyano group, a sulfinyl group, or a sulfonyl group; Y represents an alkyl group having 1 to 20 carbon atoms or an acyl group having 1 to 20 carbon atoms; "a" and "c" represent an integer of 0 to 4; "b" represents an integer of 1 to 5; "d" represents an integer of 0 to 5; P and Q represent 0 or 1; and "s" and "t" represent an integer of 0 to 2.

2. The resist composition according to claim 1, wherein the resin further contains one or more kinds of repeating unit represented by the following general formulae (UN-3) and (UN-4),

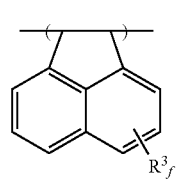

(UN-3)

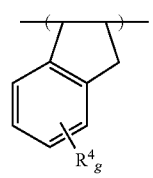

(UN-4)

wherein "f" represents an integer of 0 to 6; $R^3$ represents any of a hydrogen atom, an alkyl group or a primary or a secondary alkoxy group having 1 to 6 carbon atoms that may be halogen-substituted, and an alkylcarbonyloxy group having 1 to 7 carbon atoms that may be halogen-substituted; "g" represents an integer of 0 to 4; and $R^4$ represents any of a hydrogen atom, an alkyl group or a primary or a secondary alkoxy group having 1 to 6 carbon atoms that may be halogen-substituted, and an alkylcarbonyloxy group having 1 to 7 carbon atoms that may be halogen-substituted.

3. The resist composition according to claim 2, wherein the resist composition further contains an acid generator that generates sulfonic acid by the high energy beam exposure.

4. The resist composition according to claim 3, wherein the resist composition further contains a crosslinking agent.

5. The resist composition according to claim 4, wherein as a basic component, one or more compound represented by the following general formulae (7) to (9) are further contained,

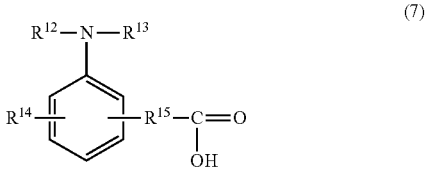

(7)

wherein each $R^{12}$ and $R^{13}$ represents a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, and $R^{12}$ and $R^{13}$ may be bonded to form a cyclic structure together with a nitrogen atom bonded by the same; $R^{14}$ represents a hydrogen atom, a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, a branched or a cyclic alkylene group having 1 to 20 carbon atoms, or an arylene group having 6 to 20 carbon atoms,

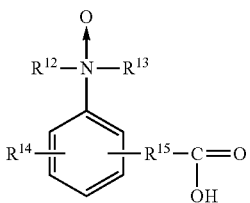

(8)

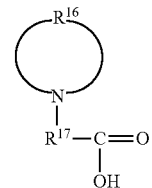

(9)

wherein $R^{12}$, $R^{13}$, $R^{14}$ and $R^{15}$ are the same as before; $R^{16}$ represents a linear or a branched alkylene group having 2 to 20 carbon atoms that can be substituted, and one or more of a carbonyl group, an ether group, an ester group, and sulfide may be contained between carbons of the alkylene group; $R^{17}$ represents a linear, a branched or a cyclic alkylene group having 1 to 20 carbon atoms, or an arylene group having 6 to 20 carbon atoms.

6. The resist composition according to claim 3, wherein as a basic component, one or more compound represented by the following general formulae (7) to (9) are further contained,

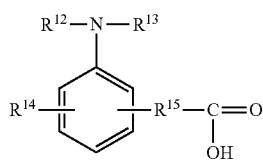

(7)

wherein each $R^{12}$ and $R^{13}$ represents a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, and $R^{12}$ and $R^{13}$ may be bonded to form a cyclic structure together with a nitrogen atom bonded by the same; $R^{14}$ represents a hydrogen atom, a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, a branched or a cyclic alkylene group having 1 to 20 carbon atoms, or an arylene group having 6 to 20 carbon atoms,

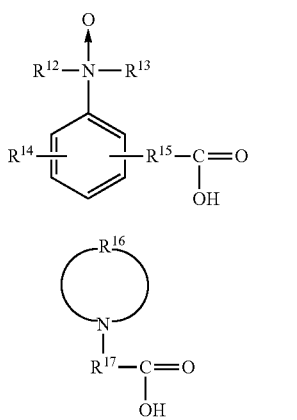

(8)

(9)

wherein $R^{12}$, $R^{13}$, $R^{14}$ and $R^{15}$ are the same as before; $R^{16}$ represents a linear or a branched alkylene group having 2 to 20 carbon atoms that can be substituted, and one or more of a carbonyl group, an ether group, an ester group, and sulfide may be contained between carbons of the alkylene group; $R^{17}$ represents a linear, a branched or a cyclic alkylene group having 1 to 20 carbon atoms, or an arylene group having 6 to 20 carbon atoms.

7. The resist composition according to claim 2, wherein the resist composition further contains a crosslinking agent.

8. The resist composition according to claim 7, wherein as a basic component, one or more compound represented by the following general formulae (7) to (9) are further contained,

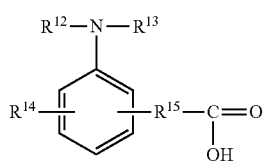

(7)

wherein each $R^{12}$ and $R^{13}$ represents a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, and $R^{12}$ and $R^{13}$ may be bonded to form a cyclic structure together with a nitrogen atom bonded by the same; $R^{14}$ represents a hydrogen atom, a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, a branched or a cyclic alkylene group having 1 to 20 carbon atoms, or an arylene group having 6 to 20 carbon atoms,

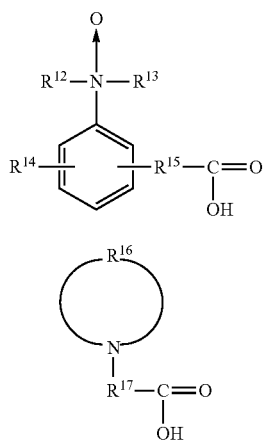

(8)

(9)

wherein $R^{12}$, $R^{13}$, $R^{14}$ and $R^{15}$ are the same as before; $R^{16}$ represents a linear or a branched alkylene group having 2 to 20 carbon atoms that can be substituted, and one or more of a carbonyl group, an ether group, an ester group, and sulfide may be contained between carbons of the alkylene group; $R^{17}$ represents a linear, a branched or a cyclic alkylene group having 1 to 20 carbon atoms, or an arylene group having 6 to 20 carbon atoms.

10. The resist composition according to claim 1, wherein the resist composition further contains an acid generator that generates sulfonic acid by the high energy beam exposure.

11. The resist composition according to claim 10, wherein the resist composition further contains a crosslinking agent.

12. The resist composition according to claim 11, wherein as a basic component, one or more compound represented by the following general formulae (7) to (9) are further contained,

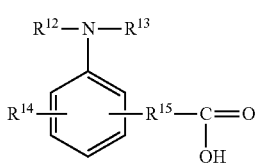

(7)

wherein each $R^{12}$ and $R^{13}$ represents a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, and $R^{12}$ and $R^{13}$ may be bonded to form a cyclic structure together with a nitrogen atom bonded by the same; $R^{14}$ represents a hydrogen atom, a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, a branched or a cyclic alkylene group having 1 to 20 carbon atoms, or an arylene group having 6 to 20 carbon atoms,

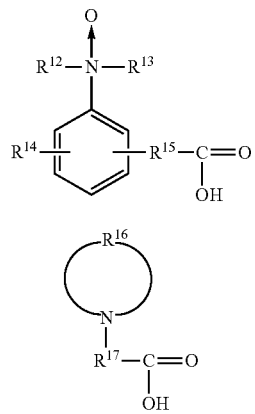

(8)

(9)

wherein $R^{12}$, $R^{13}$, $R^{14}$ and $R^{15}$ are the same as before; $R^{16}$ represents a linear or a branched alkylene group having 2 to 20 carbon atoms that can be substituted, and one or more of a carbonyl group, an ether group, an ester group, and sulfide may be contained between carbons of the alkylene group; $R^{17}$ represents a linear, a branched or a cyclic alkylene group having 1 to 20 carbon atoms, or an arylene group having 6 to 20 carbon atoms.

13. The resist composition according to claim 10, wherein as a basic component, one or more compound represented by the following general formulae (7) to (9) are further contained,

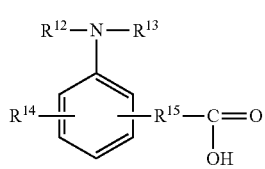

(7)

wherein each $R^{12}$ and $R^{13}$ represents a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, and $R^{12}$ and $R^{13}$ may be bonded to form a cyclic structure together with a nitrogen atom bonded by the same; $R^{14}$ represents a hydrogen atom, a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, a branched or a cyclic alkylene group having 1 to 20 carbon atoms, or an arylene group having 6 to 20 carbon atoms,

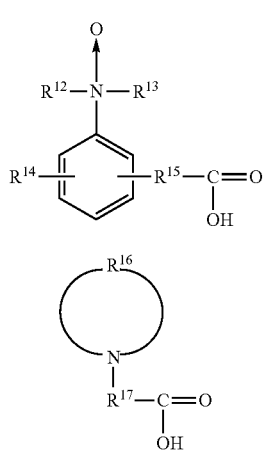

(8)

(9)

wherein $R^{12}$, $R^{13}$, $R^{14}$ and $R^{15}$ are the same as before; $R^{16}$ represents a linear or a branched alkylene group having 2 to 20 carbon atoms that can be substituted, and one or more of a carbonyl group, an ether group, an ester group, and sulfide may be contained between carbons of the alkylene group; $R^{17}$ represents a linear, a branched or a cyclic alkylene group having 1 to 20 carbon atoms, or an arylene group having 6 to 20 carbon atoms.

14. The resist composition according to claim 1, wherein the resist composition further contains a crosslinking agent.

15. The resist composition according to claim 14, wherein as a basic component, one or more compound represented by the following general formulae (7) to (9) are further contained,

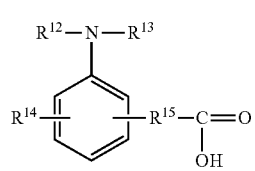

(7)

wherein each $R^{12}$ and $R^{13}$ represents a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, and $R^{12}$ and $R^{13}$ may be bonded to form a cyclic structure together with a nitrogen atom bonded by the same; $R^{14}$ represents a hydrogen atom, a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, a branched or a cyclic alkylene group having 1 to 20 carbon atoms, or an arylene group having 6 to 20 carbon atoms,

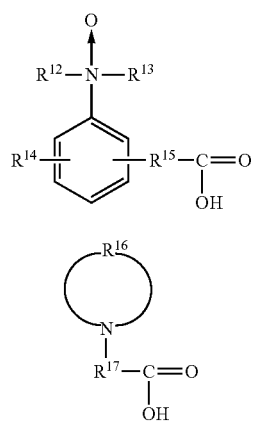

(8)

(9)

wherein $R^{12}$, $R^{13}$, $R^{14}$ and $R^{15}$ are the same as before; $R^{16}$ represents a linear or a branched alkylene group having 2 to 20 carbon atoms that can be substituted, and one or more of a carbonyl group, an ether group, an ester group, and sulfide may be contained between carbons of the alkylene group; $R^{17}$ represents a linear, a branched or a cyclic alkylene group having 1 to 20 carbon atoms, or an arylene group having 6 to 20 carbon atoms.

16. The resist composition according to claim 1, wherein as a basic component, one or more compound represented by the following general formulae (7) to (9) are further contained,

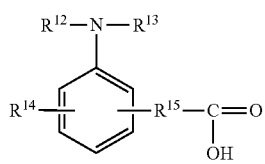

(7)

wherein each $R^{12}$ and $R^{13}$ represents a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, and $R^{12}$ and $R^{13}$ may be bonded to form a cyclic structure together with a nitrogen atom bonded by the same; $R^{14}$ represents a hydrogen atom, a linear, a branched or a cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, a branched or a cyclic alkylene group having 1 to 20 carbon atoms, or an arylene group having 6 to 20 carbon atoms,

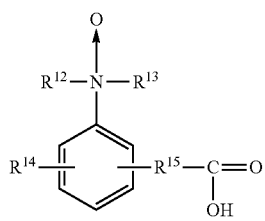

(8)

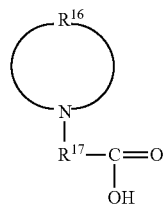

(9)

wherein $R^{12}$, $R^{13}$, $R^{14}$ and $R^{15}$ are the same as before; $R^{16}$ represents a linear or a branched alkylene group having 2 to 20 carbon atoms that can be substituted, and one or more of a carbonyl group, an ether group, an ester group, and sulfide may be contained between carbons of the alkylene group; $R^{17}$ represents a linear, a branched or a cyclic alkylene group having 1 to 20 carbon atoms, or an arylene group having 6 to 20 carbon atoms.

17. A resist patterning process comprising steps of: applying the resist composition according to claim 1 on a substrate to be processed to obtain a resist film; pattern-exposing by a high energy beam; and developing by using an alkaline developer to obtain a resist pattern.

18. The resist patterning process according to claim 17, wherein an EUV or an electron beam is used as the high energy beam.

19. The resist patterning process according to claim 17, wherein a top surface of the substrate to be processed is composed of a material containing chrome.

20. The resist patterning process according to claim 17, wherein a photo mask blank is used as the substrate to be processed.

* * * * *